United States Patent
Kim et al.

(10) Patent No.: US 11,846,966 B2
(45) Date of Patent: Dec. 19, 2023

(54) ELECTRONIC DEVICE

(71) Applicant: Samsung Display Co., Ltd., Yongin-si (KR)

(72) Inventors: Gayoung Kim, Hwaseong-si (KR); Sanghyun Lim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/987,645

(22) Filed: Nov. 15, 2022

(65) Prior Publication Data
US 2023/0168781 A1    Jun. 1, 2023

(30) Foreign Application Priority Data
Nov. 29, 2021 (KR) .................. 10-2021-0167575

(51) Int. Cl.
*G06F 3/044* (2006.01)
*H10K 59/40* (2023.01)
*G06F 3/041* (2006.01)

(52) U.S. Cl.
CPC ........... *G06F 3/0446* (2019.05); *H10K 59/40* (2023.02); *G06F 3/0412* (2013.01)

(58) Field of Classification Search
CPC ....... G06F 3/03545; G06F 2203/04101; G06F 2203/04108; G06F 3/0354
See application file for complete search history.

(56) References Cited

U.S. PATENT DOCUMENTS

| | | | |
|---|---|---|---|
| 9,830,025 B2 | 11/2017 | Han et al. | |
| 2016/0139731 A1 | 5/2016 | Kim | |
| 2020/0326805 A1* | 10/2020 | Lee | ........................ G06F 3/0412 |
| 2021/0055808 A1* | 2/2021 | Kato | ........................ G06F 3/046 |

FOREIGN PATENT DOCUMENTS

| | | |
|---|---|---|
| KR | 10-0997437 B1 | 11/2010 |
| KR | 10-2015-0014083 A | 2/2015 |
| KR | 10-1898952 B1 | 9/2018 |
| KR | 10-2081606 B1 | 2/2020 |

* cited by examiner

*Primary Examiner* — Robin J Mishler
(74) *Attorney, Agent, or Firm* — Lewis Roca Rothgerber Christie LLP

(57) ABSTRACT

An electronic device includes: a display layer; a sensor layer on the display layer and comprising an active area and a peripheral area, the sensor layer being configured to operate in a first mode and a second mode different from the first mode; and a sensor controller configured to control the sensor layer, wherein the first mode comprises a first operation period, the second mode comprises a plurality of second operation periods and a third operation period, and the sensor controller is configured to sense a first input generated by a touch in the first operation period, to sense a second input generated by an input device in one of the second operation periods, to sense a third input generated by a touch different from the touch generating the first input in a portion of the active area in the third operation period, and to calculate a first sensing value.

20 Claims, 15 Drawing Sheets

ELECTRONIC DEVICE

CROSS-REFERENCE TO RELATED APPLICATION

The present application claims priority to and the benefit of Korean Patent Application No. 10-2021-0167575, filed on Nov. 29, 2021, in the Korean Intellectual Property Office, the entire content of which is hereby incorporated by reference.

BACKGROUND

1. Field

Aspects of some embodiments of the present disclosure relate to an electronic device with relatively improved sensing reliability.

2. Description of the Related Art

An electronic device may sense an external input applied thereto from the outside of the electronic device. The external input may be, for example, a user input. The user input includes various forms of external inputs, such as a part of a user's body (e.g., a touch input from a finger), light, heat, pen, or pressure. The electronic device obtains coordinates of a pen using an electromagnetic resonance (EMR) scheme or an active electrostatic (AES) scheme.

The above information disclosed in this Background section is only for enhancement of understanding of the background and therefore the information discussed in this Background section does not necessarily constitute prior art.

SUMMARY

Aspects of some embodiments of the present disclosure include an electronic device with relatively improved sensing reliability.

Aspects of some embodiments of the inventive concept provide an electronic device including a display layer, a sensor layer on the display layer, including an active area and a peripheral area defined therein, and operated in a first mode and a second mode different from the first mode, and a sensor controller controlling the sensor layer. The first mode includes a first operation period, the second mode includes a plurality of second operation periods and a third operation period following one of the second operation periods, and the sensor controller senses a first input generated by a touch in the first operation period, senses a second input generated by an input device in one of the second operation periods, senses a third input generated by a touch different from the touch generating the first input in a portion of the active area in the third operation period, and calculates a first sensing value.

According to some embodiments, the second mode further includes a fourth operation period following another of the second operation periods, and the sensor controller senses the third input in the other portion of the active area in the fourth operation period and calculates a second sensing value.

According to some embodiments, the electronic device further includes a memory that stores the first sensing value and the second sensing value.

According to some embodiments, the sensor controller determines whether the third input is present or not based on the first sensing value and the second sensing value when the second mode is changed to the first mode.

According to some embodiments, each of the first sensing value and the second sensing value includes shape information and location information of the touch.

According to some embodiments, the first mode and the second mode are repeated, and the sensor controller senses the third input based on the shape information and the location information and ignores the third input when sensing the first input in a next first mode.

According to some embodiments, the sensor layer includes a plurality of first electrodes extending in a first direction and a plurality of second electrodes extending in a second direction crossing the first direction.

According to some embodiments, the first operation period includes a first sensing period and a second sensing period, the sensor layer senses the first input using the first electrodes and the second electrodes integrated into one electrode with the first electrodes in the first sensing period, and the sensor layer senses the first input using the first electrodes and the second electrodes capacitively coupled to the first electrodes in the second sensing period.

According to some embodiments, the second operation period includes a first period and a second period, the sensor layer outputs a recognition signal in the first period to recognize the input device, and the sensor layer senses the second input in the second period.

According to some embodiments, the sensor layer senses the third input using the first electrodes and the second electrodes integrated into one electrode with the first electrodes in the third operation period.

Aspects of some embodiments of the inventive concept include an electronic device including a display layer, a sensor layer on the display layer, including an active area and a peripheral area defined therein, and repeatedly operated in a first mode and a second mode different from the first mode, and a sensor controller controlling the sensor layer. The active area includes a first area and a second area adjacent to the first area, the first mode includes a first operation period, the second mode includes a plurality of second operation periods, a third operation period following one of the second operation periods, and a fourth operation period following another of the second operation periods. The sensor controller senses a first input generated by a touch in the first operation period and senses a second input generated by an input device in the one of the second operation periods, and the sensor layer senses a third input generated by a touch different from the touch generating in the first area in the third operation period to calculate a first sensing value and senses the third input in the second area in the fourth operation period to calculate a second sensing value.

According to some embodiments, the first area and the second area have a same size.

According to some embodiments, the electronic device further includes a memory that stores the first sensing value and the second sensing value.

According to some embodiments, the sensor controller determines whether the third input is present or not based on the first sensing value and the second sensing value when the second mode is changed to the first mode.

According to some embodiments, each of the first sensing value and the second sensing value includes shape information and location information of the touch.

According to some embodiments, the sensor controller senses the third input based on the shape information and the location information and ignores the third input when sensing the first input in a next first mode.

According to some embodiments, the sensor layer includes a plurality of first electrodes extending in a first direction and a plurality of second electrodes extending in a second direction crossing the first direction.

According to some embodiments, the first operation period includes a first sensing period and a second sensing period, the sensor layer senses the first input using the first electrodes and the second electrodes integrated into one electrode with the first electrodes in the first sensing period, and the sensor layer senses the first input using the first electrodes and the second electrodes capacitively coupled to the first electrodes in the second sensing period.

According to some embodiments, the second operation period includes a first period and a second period, the sensor layer outputs a recognition signal in the first period to recognize the input device, and the sensor layer senses the second input in the second period.

According to some embodiments, the sensor layer senses the third input using the first electrodes and the second electrodes integrated into one electrode with the first electrodes in the third operation period.

According to some embodiments, when the operation mode of the sensor controller is changed from the second mode in which the second input by the input device is sensed to the first mode in which the first input by the user's body is sensed, the third input by the user, which is unnecessary and unintended, is able to be removed, the first input is accurately sensed, and a ghost touch phenomenon may be prevented or reduced. Thus, the sensing reliability of the electronic device may be improved.

BRIEF DESCRIPTION OF THE DRAWINGS

The above and other characteristics of embodiments according to the present disclosure will become readily apparent by reference to the following detailed description when considered in conjunction with the accompanying drawings wherein.

DETAILED DESCRIPTION

Figure 1:
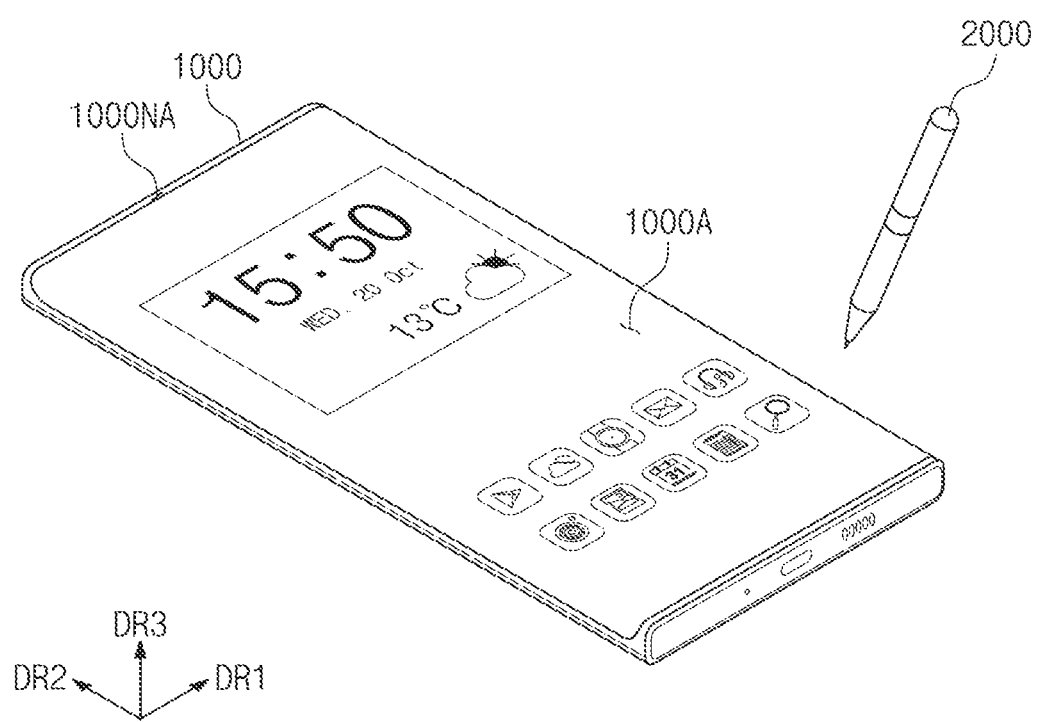
FIG. 1 is a perspective view of an electronic device and an input device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in more detail with reference to the accompanying drawings.

FIG. 1 is a perspective view of an electronic device 1000 and an input device 2000 according to some embodiments of the present disclosure.

Referring to FIG. 1, the electronic device 1000 may be a device that is activated in response to electrical signals. For example, the electronic device 1000 may be a mobile phone, a tablet computer, a car navigation unit, a game unit, or a wearable device, however, embodiments according to the present disclosure are not limited thereto or thereby. In FIG. 1, the mobile phone is shown as a representative example of the electronic device 1000.

The electronic device 1000 may include an active area 1000A and a peripheral area 1000NA, which are defined therein. The electronic device 1000 may display an image through the active area 1000A. The active area 1000A may include a plane defined by a first direction DR1 and a second direction DR2. The peripheral area 1000NA may surround the active area 1000A.

A thickness direction of the electronic device 1000 may be substantially parallel to a third direction DR3 crossing the first direction DR1 and the second direction DR2 in a direction that is perpendicular or normal with respect to a plane defined by the first direction DR1 and the second direction DR2. Accordingly, front (or upper) and rear (or lower) surfaces of each member of the electronic device 1000 may be defined with respect to the third direction DR3.

The electronic device 1000 may sense an external input applied thereto from the outside of the electronic device 1000. The external input may include a variety of forms of external inputs, such as a part of the user's body, light, heat, or pressure. The external inputs in the forms described above may be referred to as a first input.

The electronic device 1000 shown in FIG. 1 may sense an input generated by a user's touch or an input generated by the input device 2000. The input device 2000 may mean a device other than the part of the user's body. The input generated by the input device 2000 may be referred to as a second input. For example, the input device 2000 may be an active pen, a stylus pen, a touch pen, an electronic pen, or the like.

The electronic device 1000 and the input device 2000 may communicate bi-directionally with each other. The electronic device 1000 may apply an uplink signal to the input device 2000. The uplink signal may include a synchronization signal or information about the electronic device 1000, however, embodiments according to the present disclosure are not limited thereto. The input device 2000 may apply a downlink signal to the electronic device 1000. The downlink signal may include a synchronization signal or status information of the input device 2000. For example, the downlink signal may include coordinate information of the input device 2000, battery information of the input device 2000, slope information of the input device 2000, and/or various information stored in the input device 2000, however, embodiments according to the present disclosures are not limited thereto. The uplink signal and the downlink signal will be described in detail later.

Figure 2:
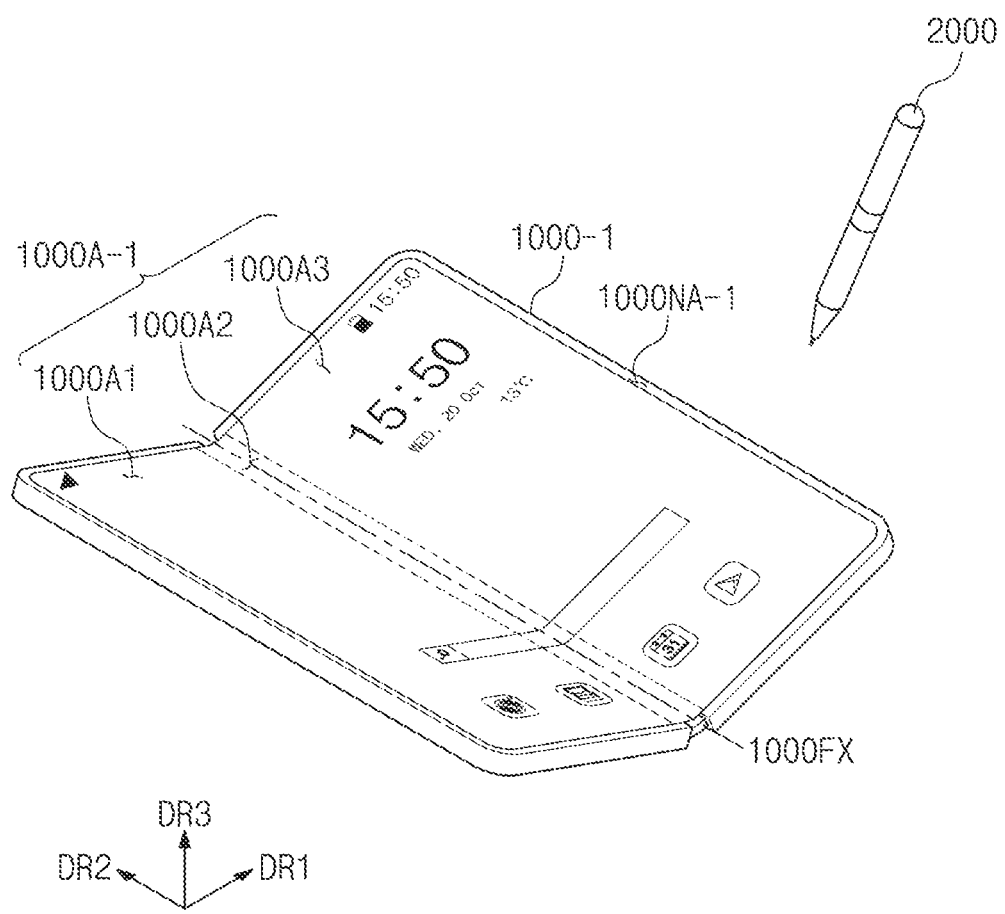
FIG. 2 is a perspective view of an electronic device and an input device according to some embodiments of the present disclosure.

FIG. 2 is a perspective view of an electronic device 1000-1 and an input device 2000 according to some embodiments of the present disclosure. In FIG. 2, the same reference numerals denote the same elements in FIG. 1, and thus, some detailed descriptions of the same elements may be omitted.

Referring to FIG. 2, the electronic device 1000-1 may display an image through an active area 1000A-1. FIG. 2 shows the electronic device 1000-1 folded at a predetermined angle. When the electronic device 1000-1 is in an unfolded state, the active area 1000A-1 may include a plane defined by the first direction DR1 and the second direction DR2.

The active area 1000A-1 may include a first area 1000A1, a second area 1000A2, and a third area 1000A3. The first area 1000A1, the second area 1000A2, and the third area 1000A3 may be sequentially arranged in the first direction DR1. The second area 1000A2 may be folded with respect to a folding axis 1000FX extending in the second direction DR2. Accordingly, the first area 1000A1 and the third area 1000A3 may be referred to as non-folding areas, and the second area 1000A2 may be referred to as a folding area.

When the electronic device 1000-1 is folded, the first area 1000A1 and the third area 1000A3 may face each other. Accordingly, the active area 1000A-1 may not be exposed to the outside in a state where the electronic device 1000-1 is completely folded, and this may be referred to as an in-folding state. However, this is merely an example, and the folding operation of the electronic device 1000-1 should not be limited thereto or thereby.

As an example, according to some embodiments, the electronic device 1000-1 may be folded to allow the first area 1000A1 and the third area 1000A3 to face directions opposite to each other. In this case, the active area 1000A-1 may be exposed to the outside, and this may be referred to as an out-folding state.

The electronic device 1000-1 may be operated in only one of the in-folding operation or the out-folding operation. According to some embodiments, the electronic device 1000-1 may be operated in both the in-folding operation and the out-folding operation. In this case, the second area 1000A2 of the electronic device 1000-1 may be inwardly folded (in-folding) and outwardly folded (out-folding).

FIG. 2 shows one folding area and two non-folding areas as a representative example, however, the number of folding areas and the number of non-folding areas should not be limited thereto or thereby. As an example, the electronic device 1000-1 may include three or more non-folding areas and a plurality of folding areas located between the non-folding areas adjacent to each other.

As shown in FIG. 2, the folding axis 1000FX extends in the second direction DR2, however, embodiments according to the present disclosure are not limited thereto or thereby. For example, the folding axis 1000FX may extend in a direction substantially parallel to the first direction DR1. In this case, the first area 1000A1, the second area 1000A2, and the third area 1000A3 may be sequentially arranged in the second direction DR2.

The active area 1000A-1 may overlap at least one electronic module. For example, the electronic modules may include a camera module and a proximity illumination sensor. The electronic modules may receive an external input applied thereto through the active area 1000A-1 or may provide an output through the active area 1000A-1. A portion of the active area 1000A-1 overlapping the camera module and the proximity illumination sensor may have a transmittance higher than that of the other portion of the active area 1000A-1. Accordingly, it may not be required to provide an area to arrange the electronic modules in a peripheral area 1000NA-1 around the active area 1000A-1. As a result, a ratio of the active area 1000A-1 to an entire surface of the electronic device 1000-1 may increase.

The electronic device 1000-1 and the input device 2000 may communicate bi-directionally with each other. The electronic device 1000-1 may apply an uplink signal to the input device 2000. The input device 2000 may apply a downlink signal to the electronic device 1000-1. The electronic device 1000-1 may sense coordinates of the input device 2000 using the signal provided from the input device 2000.

Figure 3:
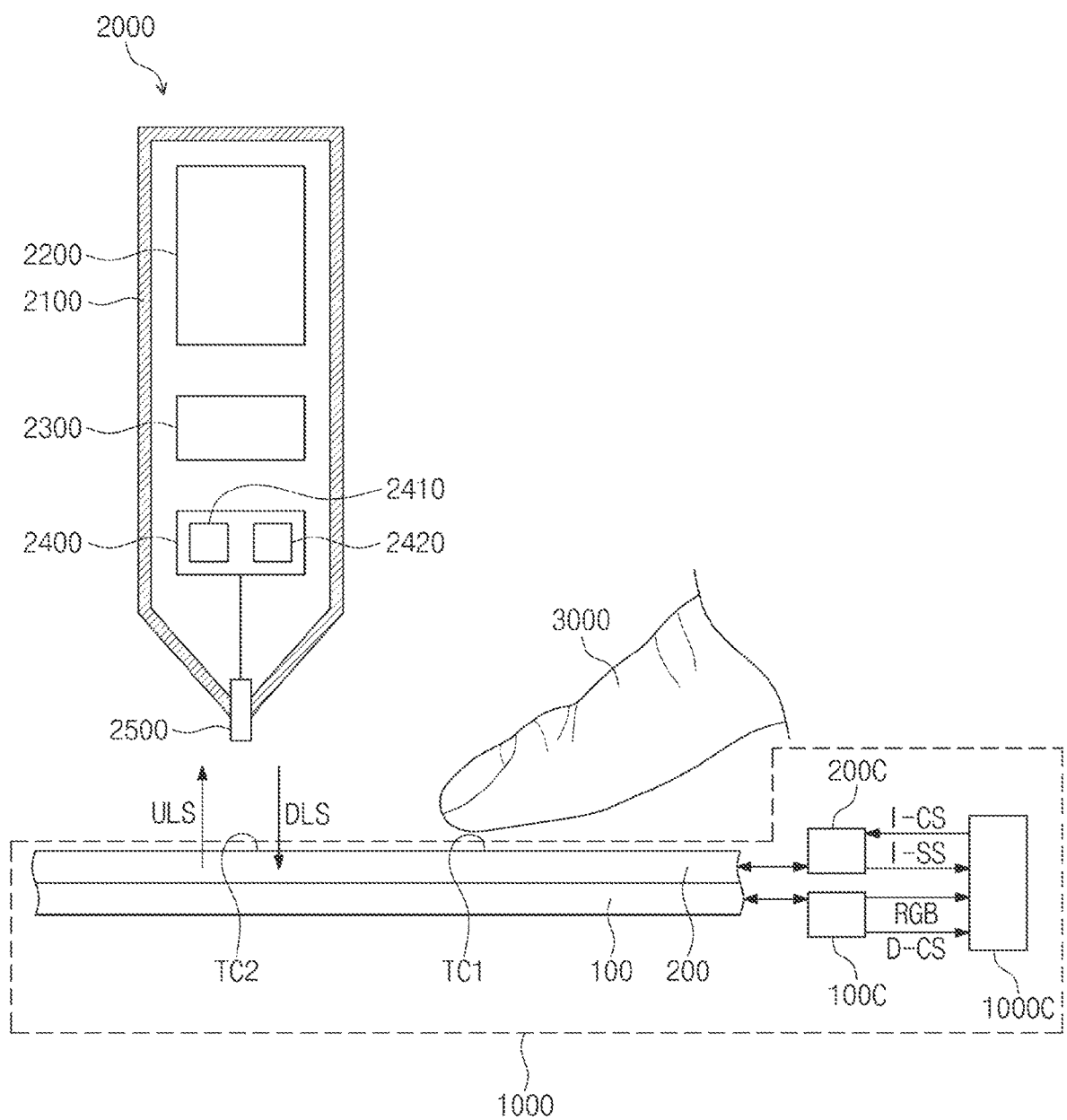
FIG. 3 is a block diagram of an electronic device and an input device according to some embodiments of the present disclosure.

FIG. 3 is a block diagram of an electronic device and an input device according to some embodiments of the present disclosure.

Referring to FIG. 3, the electronic device 1000 may include a display layer 100, a sensor layer 200, a display controller 100C, a sensor controller 2000, and a main controller 1000C.

The display layer 100 may have a configuration to generate the image. The display layer 100 may be a light emitting type display layer. For example, the display layer 100 may be an organic light emitting display layer, a quantum dot display layer, a micro-LED display layer, or a nano-LED display layer.

The sensor layer 200 may be located on the display layer 100. The sensor layer 200 may sense an input applied thereto from the outside. The sensor layer 200 may sense the second input generated by the input device 2000 and the first input generated by a user's body 3000.

The main controller 1000C may control an overall operation of the electronic device 1000. For instance, the main controller 1000C may control an operation of the display controller 100C and the sensor controller 2000. The main controller 1000C may include at least one microprocessor, and the main controller 1000C may be referred to as a host.

The display controller 100C may control the display layer 100. The main controller 1000C may further include a graphics controller. The display controller 100C may receive image data RGB and a control signal D-CS from the main controller 1000C. The control signal D-CS may include a variety of signals. For example, the control signal D-CS may include an input vertical synchronization signal, an input horizontal synchronization signal, a main clock, and a data enable signal. The display controller 100C may generate a vertical synchronization signal and a horizontal synchronization signal based on the control signal D-CS to control a timing at which signals are applied to the display layer 100.

The sensor controller 2000 may control the sensor layer 200. The sensor controller 2000 may receive a control signal I-CS from the main controller 1000C. The control signal I-CS may include a mode determination signal to determine a driving mode of the sensor controller 2000 and a clock signal. The sensor controller 2000 may be operated in a first mode to sense the first input TC1 by the user's body 3000 or in a second mode to sense the second input TC2 by the input device 2000 based on the control signal I-CS. That is, the sensor controller 2000 may control the sensor layer 200 in the first mode or the second mode based on the mode determination signal.

The sensor controller 2000 may calculate coordinate information of the first input or the second input based on the signal from the sensor layer 200 and may apply a coordinate signal I-SS having the coordinate information to the main controller 1000C. The main controller 1000C may perform an operation corresponding to the user's input based on the coordinate signal I-SS. For example, the main controller 1000C may drive the display controller 100C based on the coordinate signal I-SS such that the display layer 100 may display a new application image.

The input device 2000 may include a housing 2100, a power supply 2200, a controller 2300, a communication module 2400, and a pen electrode 2500. However, elements of the input device 2000 are not limited to the above-mentioned elements. For example, the input device 2000 may further include an electrode switch to switch a signal transmission mode to a signal reception mode and vice versa, a pressure sensor to sense a pressure, a memory to store information, or a gyro sensor to sense a rotation.

The housing 2100 may have a pen shape and may include an accommodating space defined therein. The power supply 2200, the controller 2300, the communication module 2400, and the pen electrode 2500 may be accommodated in the accommodating space defined in the housing 2100.

The power supply 2200 may supply a power to modules in the input device 2000, for example, the controller 2300, the communication module 2400, and the like. The power supply 2200 may include a battery or a high capacity capacitor.

The controller 2300 may control an operation of the input device 2000. The controller 2300 may be, but is not limited to, an application-specific integrated circuit (ASIC). The controller 2300 may be configured to operate according to a designed program.

The communication module 2400 may include a transmitter circuit 2410 and a receiver circuit 2420. The transmitter circuit 2410 may output a downlink signal DLS to the sensor layer 200. The receiver circuit 2420 may receive an uplink signal ULS from the sensor layer 200. The transmitter circuit 2410 may receive a signal from the controller 2300 and may modulate the signal into a signal that is able to be sensed by the sensor layer 200, and the receiver circuit 2420 may modulate a signal from the sensor layer 200 into a signal that is able to be processed by the controller 2300.

The pen electrode 2500 may be electrically connected to the communication module 2400. A portion of the pen electrode 2500 may be protruded from the housing 2100. In addition, the input device 2000 may further include a cover housing that covers the pen electrode 2500 exposed without being covered by the housing 2100. Alternatively, the pen electrode 2500 may be built in the housing 2100.

Figure 4A:
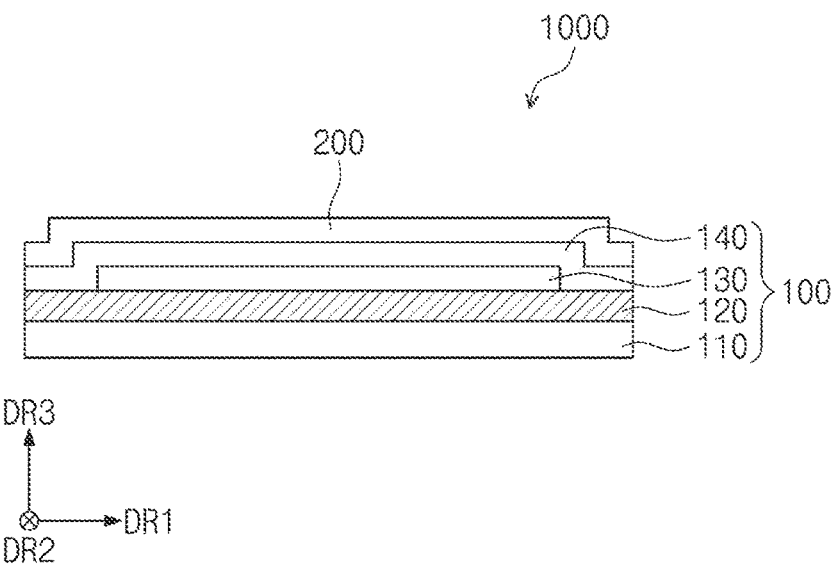
FIG. 4A is a cross-sectional view of an electronic device according to some embodiments of the present disclosure.

FIG. 4A is a cross-sectional view of the electronic device 1000 according to some embodiments of the present disclosure.

Referring to FIG. 4A, the electronic device 1000 may include the display layer 100 and the sensor layer 200. The display layer 100 may include a base layer 110, a circuit layer 120, a light emitting element layer 130, and an encapsulation layer 140.

The base layer 110 may provide a base surface on which the circuit layer 120 is located. The base layer 110 may be a glass substrate, a metal substrate, or a polymer substrate. However, the embodiments according to the present disclosure are not limited thereto or thereby, and according to some embodiments, the base layer 110 may be an inorganic layer, an organic layer, or a composite material layer.

The base layer 110 may have a multi-layer structure. For instance, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, the term "X-based resin", as used herein, refers to the resin that includes a functional group of X.

The circuit layer 120 may be located on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. The semiconductor pattern, the conductive pattern, and the signal line included in the circuit layer 120 may be formed.

The light emitting element layer 130 may be located on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and a foreign substance such as dust particles.

The sensor layer 200 may be formed on the display layer 100 through successive processes. In this case, the sensor layer 200 may be located directly on the display layer 100. In the following descriptions, the expression "the sensor layer 200 is located directly on the display layer 100" means that no intervening elements are present between the sensor layer 200 and the display layer 100. That is, a separate adhesive member may not be located between the sensor layer 200 and the display layer 100. Alternatively, the sensor layer 200 may be coupled with the display layer 100 by an adhesive layer. The adhesive layer may be any suitable adhesive material capable of adhering the sensor layer to the display layer.

Figure 4B:
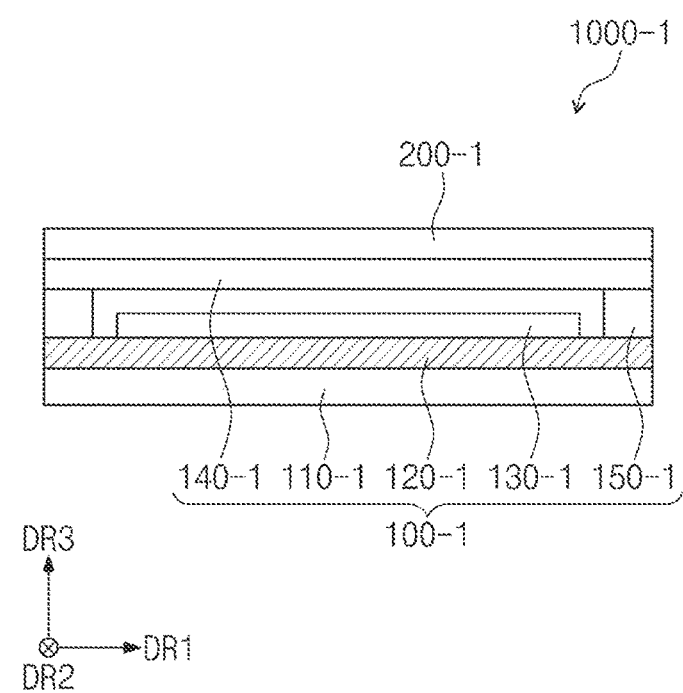
FIG. 4B is a cross-sectional view of an electronic device according to some embodiments of the present disclosure.

FIG. 4B is a cross-sectional view of the electronic device 1000-1 according to some embodiments of the present disclosure.

Referring to FIG. 4B, the electronic device 1000-1 may include a display layer 100-1 and a sensor layer 200-1. The display layer 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be a glass substrate, a metal substrate, or a polymer substrate, however, the embodiments according to the present disclosure are not limited thereto.

The coupling member 150-1 may be located between the base substrate 110-1 and the encapsulation substrate 140-1. The encapsulation substrate 140-1 may be coupled with the base substrate 110-1 or the circuit layer 120-1 by the coupling member 150-1. The coupling member 150-1 may include an inorganic material or an organic material. For example, the inorganic material may include a frit seal, and the organic material may include a photocurable resin or a photoplastic resin. However, the material for the coupling member 150-1 is not limited thereto or thereby.

The sensor layer 200-1 may be located directly on the encapsulation substrate 140-1. In the following descriptions, the expression "the sensor layer 200-1 is located directly on the encapsulation substrate 140-1" means that no intervening elements are present between the sensor layer 200-1 and the encapsulation substrate 140-1. That is, a separate adhesive member may not be located between the sensor layer 200-1 and the encapsulation substrate 140-1, however, it should not be limited thereto or thereby. According to some embodiments, an adhesive layer may be further located between the sensor layer 200-1 and the encapsulation substrate 140-1.

Figure 5:
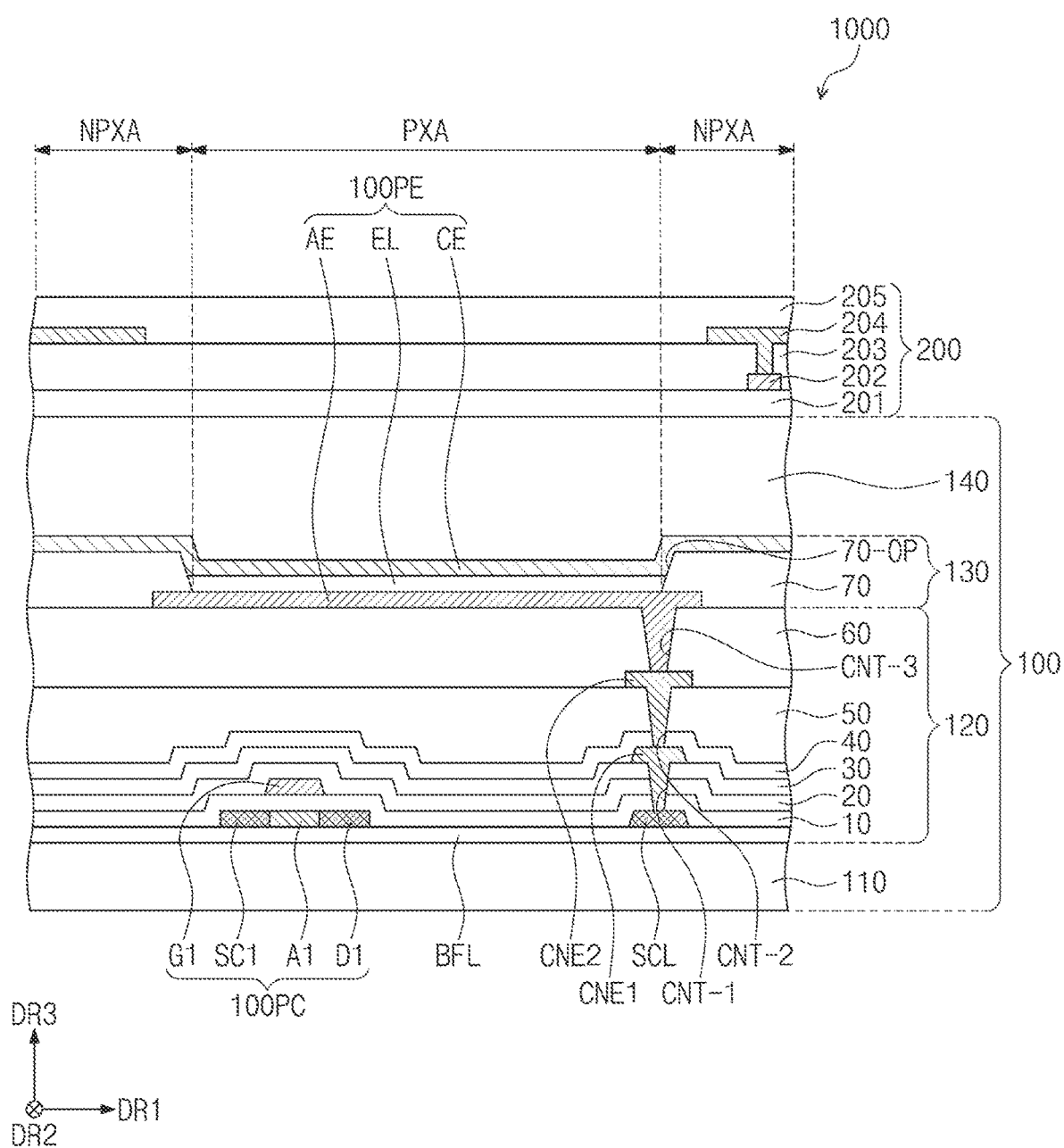
FIG. 5 is a cross-sectional view of an electronic device according to some embodiments of the present disclosure.

FIG. 5 is a cross-sectional view of the electronic device 1000 according to some embodiments of the present disclosure. In FIG. 5, the same reference numerals denote the same elements in FIG. 4A, and thus, some detailed descriptions of the same elements may be omitted.

Referring to FIG. 5, at least one inorganic layer may be formed on an upper surface of the base layer 110. The inorganic layer may include at least one of aluminum oxide, titanium oxide, silicon oxide, silicon oxynitride, zirconium oxide, or hafnium oxide. The inorganic layer may be formed in multiple layers. The inorganic layers formed in multiple layers may form a barrier layer and/or a buffer layer. According to some embodiments, the display layer 100 may include a buffer layer BFL.

The buffer layer BFL may increase an adhesion between the base layer 110 and the semiconductor pattern. The buffer layer BFL may include a silicon oxide layer and a silicon nitride layer, and the silicon oxide layer and the silicon nitride layer may be alternately stacked with each other.

The semiconductor pattern may be located on the buffer layer BFL. The semiconductor pattern may include polysilicon, however, embodiments according to the present disclosures are not limited thereto or thereby. The semiconductor pattern may include amorphous silicon, low-temperature polycrystalline silicon, or oxide semiconductor.

FIG. 5 shows only a portion of the semiconductor pattern, and the semiconductor pattern may be further located in other areas. The semiconductor pattern may be arranged with a specific rule over the pixels. The semiconductor pattern may have different electrical properties depending on whether it is doped or not or whether it is doped with an N-type dopant or a P-type dopant. The semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the first region.

The first region may have a conductivity greater than that of the second region and may substantially serve as an electrode or signal line. The second region may substantially correspond to an active (or a channel) of a transistor. In other words, a portion of the semiconductor pattern may be the active of the transistor, another portion of the semiconductor pattern may be a source or a drain of the transistor, and the other portion of the semiconductor pattern may be a connection electrode or a connection signal line.

Each of the pixels may have an equivalent circuit that includes seven transistors, one capacitor, and the light emitting element, and the equivalent circuit of the pixels may be changed in various ways. FIG. 5 shows one transistor 100PC and the light emitting element 100PE included in the pixel.

The transistor 100PC may include a source SC1, an active A1, a drain D1, and a gate G1. The source SC1, the active A1, and the drain D1 may be formed from the semiconductor pattern. The source SC1 and the drain D1 may extend in opposite directions to each other from the active A1 in a cross-section. FIG. 5 shows a portion of the connection signal line SCL formed from the semiconductor pattern. According to some embodiments, the connection signal line SCL may be electrically connected to the drain D1 of the transistor 100PC in a plane.

A first insulating layer 10 may be located on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may have a single-layer structure of a silicon oxide layer. Not only the first insulating layer 10, but also an insulating layer of the circuit layer 120 described in more detail later may be an inorganic layer and/or an organic layer and may have a single-layer or multi-layer structure. The inorganic layer may include at least one of the above-mentioned materials, however, embodiments according to the present disclosure are not limited thereto.

The gate G1 of the transistor 100PC may be located on the first insulating layer 10. The gate G1 may be a portion of a metal pattern. The gate G1 may overlap the active A1. The gate G1 may be used as a mask in a process of doping the semiconductor pattern.

A second insulating layer 20 may be located on the first insulating layer 10 and may cover the gate G1. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, or silicon oxynitride. According to some embodiments, the second insulating layer 20 may have a multi-layer structure of a silicon oxide layer and a silicon nitride layer.

A third insulating layer 30 may be located on the second insulating layer 20. The third insulating layer 30 may have a single-layer structure or a multi-layer structure. As an example, the third insulating layer 30 may have the multi-layer structure of a silicon oxide layer and a silicon nitride layer.

A first connection electrode CNE1 may be located on the third insulating layer 30. The first connection electrode CNE1 may be connected to the connection signal line SCL via a contact hole CNT-1 defined through the first, second, and third insulating layers 10, 20, and 30.

A fourth insulating layer 40 may be located on the third insulating layer 30. The fourth insulating layer 40 may have a single-layer structure of a silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be located on the fifth insulating layer 50 and may cover the second connection electrode CNE2. The sixth insulating layer 60 may be an organic layer.

The light emitting element layer 130 may be located on the circuit layer 120. The light emitting element layer 130 may include the light emitting element 100PE. For example, the light emitting element layer 130 may include an organic light emitting material, a quantum dot, a quantum rod, a micro-LED, or a nano-LED. Hereinafter, the organic light emitting element will be described as the light emitting element 100PE, however, the light emitting element 100PE should not be particularly limited.

The light emitting element 100PE may include a first electrode AE, a light emitting layer EL, and a second electrode CE. The first electrode AE may be located on the sixth insulating layer 60. The first electrode AE may be connected to the second connection electrode CNE2 via a contact hole CNT-3 defined through the sixth insulating layer 60.

A pixel definition layer 70 may be located on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The active area 1000A (refer to FIG. 1) may include a light emitting area PXA and a non-light-emitting area NPXA adjacent to the light emitting area PXA. The non-light-emitting area NPXA may surround the light emitting area PXA. According to some embodiments, the light emitting area PXA may correspond to the portion of the first electrode AE exposed through the opening 70-OP.

The light emitting layer EL may be located on the first electrode AE. The light emitting layer EL may be located in an area corresponding to the opening 70-OP. That is, the light emitting layer EL may be formed in each of the pixels after being divided into plural portions. In the case where the light emitting layer EL is formed in each of the pixels after being divided into plural portions, each of the light emitting layers EL may emit a light having at least one of blue, red, or green colors, however, it should not be limited thereto or thereby. The light emitting layer EL may be commonly provided in the pixels. In this case, the light emitting layer EL may provide a blue light or a white light.

The second electrode CE may be located on the light emitting layer EL. The second electrode CE may have an integral shape and may be commonly arranged over the pixels.

According to some embodiments, a hole control layer may be located between the first electrode AE and the light emitting layer EL. The hole control layer may be commonly located in the light emitting area PXA and the non-light-emitting area NPXA. The hole control layer may include a hole transport layer and may further include a hole injection layer. An electron control layer may be located between the light emitting layer EL and the second electrode CE. The electron control layer may include an electron transport layer and may further include an electron injection layer. The hole control layer and the electron control layer may be commonly formed in the plurality of pixels using an open mask.

The encapsulation layer 140 may be located on the light emitting element layer 130. The encapsulation layer 140 may include an inorganic layer, an organic layer, and an inorganic layer, which are sequentially stacked, however, layers of the encapsulation layer 140 should not be limited thereto or thereby.

The inorganic layers may protect the light emitting element layer 130 from moisture and oxygen, and the organic layer may protect the light emitting element layer 130 from a foreign substance such as dust particles. Each of the inorganic layers may include a silicon nitride layer, a silicon oxynitride layer, a silicon oxide layer, a titanium oxide layer, or an aluminum oxide layer. The organic layer may include an acrylic-based organic layer, however, embodiments according to the present disclosure are not limited thereto or thereby.

The sensor layer 200 may be formed on the display layer 100 through successive processes. That is, the sensor layer 200 may be located directly on the display layer 100. In the present disclosure, the expression "the sensor layer 200 is located directly on the display layer 100" means that no intervening elements are present between the sensor layer 200 and the display layer 100. That is, a separate adhesive member may not be located between the sensor layer 200 and the display layer 100. Alternatively, the sensor layer 200 may be coupled with the display layer 100 by the adhesive layer. The adhesive layer may be any suitable adhesive material capable of adhering the sensor layer 200 to the display layer 100.

The sensor layer 200 may include a base insulating layer 201, a first conductive layer 202, a sensing insulating layer 203, a second conductive layer 204, and a cover insulating layer 205.

The base insulating layer 201 may be an inorganic layer that includes at least one of silicon nitride, silicon oxynitride, or silicon oxide. Alternatively, the base insulating layer 201 may be an organic layer that includes an epoxy-based resin, an acrylic-based resin, or an imide-based resin. The base insulating layer 201 may have a single-layer structure or a multi-layer structure of layers stacked one on another in the third direction DR3.

Each of the first conductive layer 202 and the second conductive layer 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, a graphene, or the like.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

At least one of the sensing insulating layer 203 or the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least one of the sensing insulating layer 203 or the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 6:
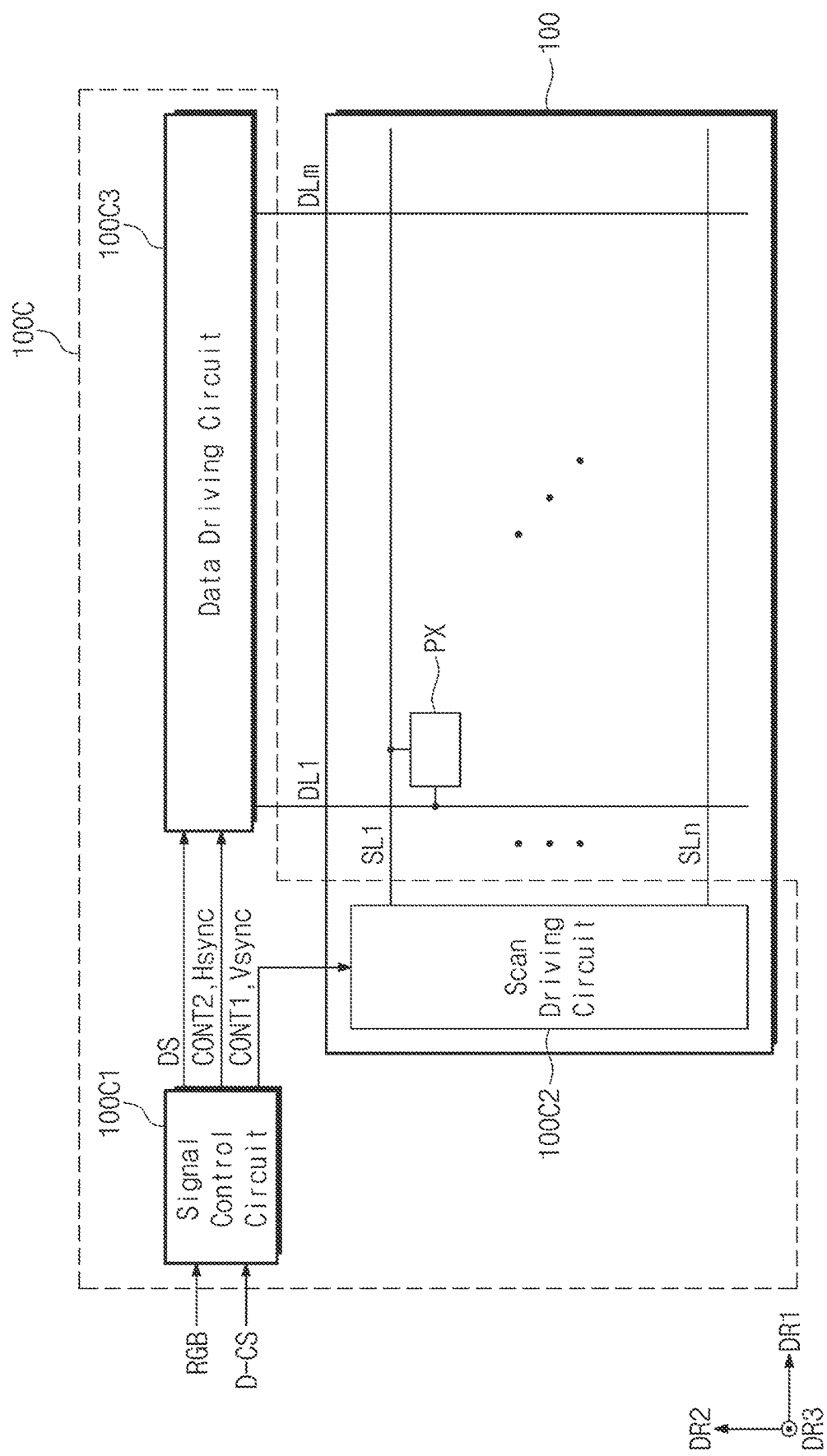
FIG. 6 is a block diagram of a display layer and a display controller according to some embodiments of the present disclosure.

FIG. 6 is a block diagram of the display layer 100 and the display controller 1000 according to some embodiments of the present disclosure.

Referring to FIG. 6, the display layer 100 may include a plurality of scan lines SL1 to SLn, a plurality of data lines DL1 to DLm, and a plurality of pixels PX. Each of the pixels PX may be connected to a corresponding data line of the data lines DL1 to DLm and a corresponding scan line of the scan lines SL1 to SLn. According to some embodiments, the display layer 100 may further include light emission control lines, and the display controller 1000 may further include a light emission driving circuit applying control signals to the light emission control lines. Configurations of the display layer 100 should not be particularly limited.

The display controller 1000 may include a signal control circuit 10001, a scan driving circuit 10002, and a data driving circuit 10003.

The signal control circuit 10001 may receive the image data RGB and the control signal D-CS from the main controller 1000C (refer to FIG. 3). The control signal D-CS may include a variety of signals. As an example, the control signal D-CS may include the input vertical synchronization signal, the input horizontal synchronization signal, the main clock, and the data enable signal.

The signal control circuit 10001 may generate a first control signal CONT1 and the vertical synchronization signal Vsync based on the control signal D-CS and may output the first control signal CONT1 and the vertical synchronization signal Vsync to the scan driving circuit 10002. The vertical synchronization signal Vsync may be included in the first control signal CONT1.

The signal control circuit 10001 may generate a second control signal CONT2 and the horizontal synchronization signal Hsync based on the control signal D-CS and may output the second control signal CONT2 and the horizontal synchronization signal Hsync to the data driving circuit 100C3. The horizontal synchronization signal Hsync may be included in the second control signal CONT2.

In addition, the signal control circuit 100C1 may output a data signal DS obtained by processing the image data RGB according to an operational condition of the display layer 100 to the data driving circuit 100C3. The first control signal CONT1 and the second control signal CONT2 may be signals required for an operation of the scan driving circuit 100C2 and the data driving circuit 100C3 and should not be particularly limited.

The scan driving circuit 100C2 may drive the scan lines SL1 to SLn in response to the first control signal CONT1 and the vertical synchronization signal Vsync. According to some embodiments, the scan driving circuit 100C2 may be formed through the same process as the circuit layer 120 (refer to FIG. 5) of the display layer 100, however, it should not be limited thereto or thereby. As an example, the scan driving circuit 100C2 may be directly mounted on a predetermined area of the display layer 100 after being implemented in an integrated circuit (IC) or may be electrically connected to the display layer 100 after being mounted on a separate printed circuit board in a chip-on-film (COF).

The data driving circuit 100C3 may output grayscale voltages to drive the data lines DL1 to DLm in response to the second control signal CONT2, the horizontal synchronization signal Hsync, and the data signal DS from the signal control circuit 100C1. The data driving circuit 100C3 may be directly mounted on a predetermined area of the display layer 100 after being implemented in an integrated circuit (IC) or may be electrically connected to the display layer 100 after being mounted on a separate printed circuit board in a chip-on-film (COF), however, embodiments according to the present disclosure are not limited thereto or thereby. For example, the data driving circuit 100C3 may be formed through the same process as the circuit layer 120 (refer to FIG. 5) of the display layer 100.

Figure 7:
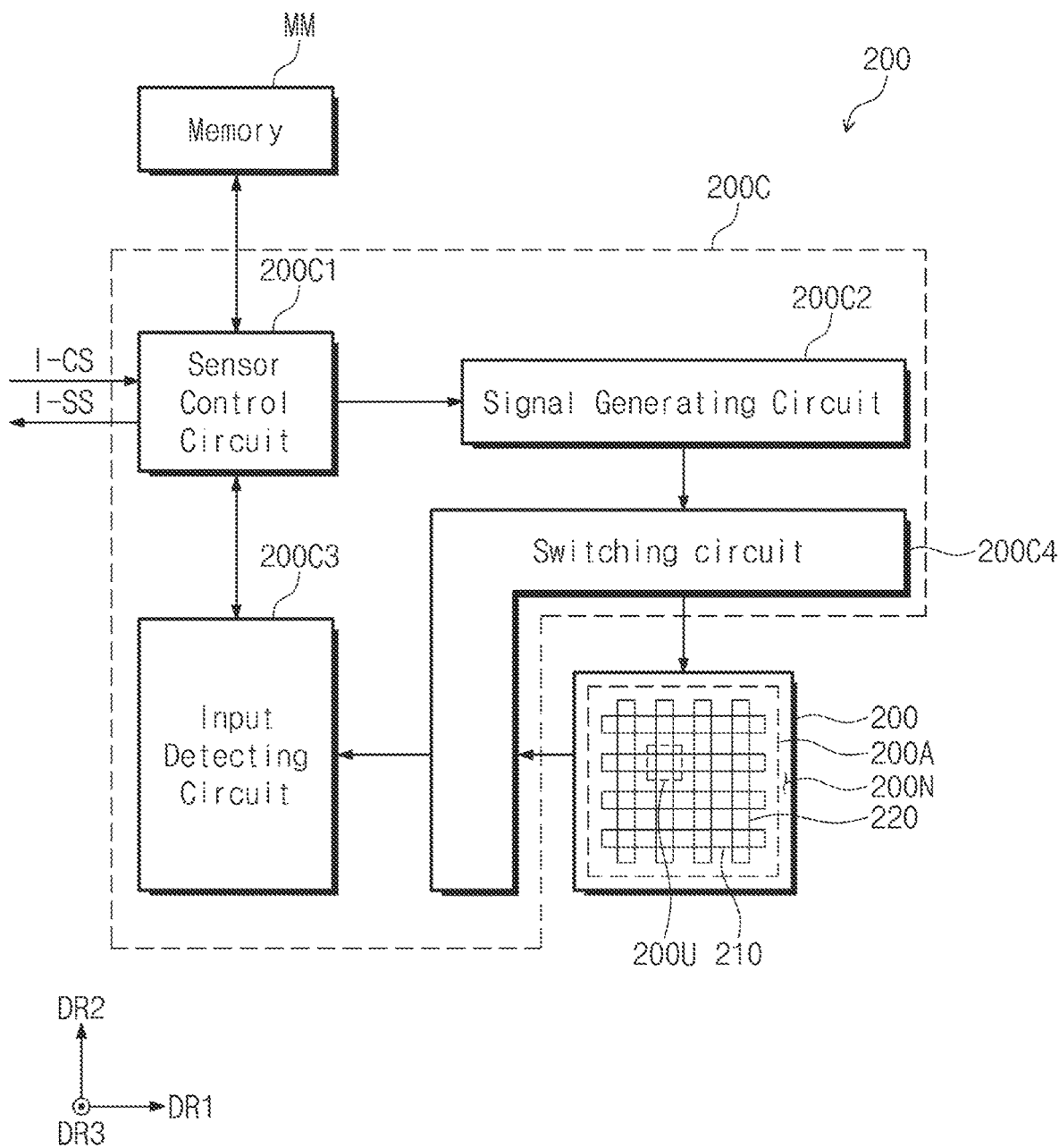
FIG. 7 is a block diagram of a sensor layer and a sensor controller according to some embodiments of the present disclosure.

FIG. 7 is a block diagram of the sensor layer 200 and the sensor controller 2000 according to some embodiments of the present disclosure.

Referring to FIG. 7, the sensor layer 200 may include an active area 200A and a peripheral area 200N. The active area 200A may be activated in response to an electrical signal. For example, the active area 200A may be an area to sense the input. The active area 200A may overlap the active area 1000A (refer to FIG. 1) of the electronic device 1000 (refer to FIG. 1). The peripheral area 200N may surround the active area 200A. The peripheral area 200N may overlap the peripheral area 1000NA (refer to FIG. 1) of the electronic device 1000 (refer to FIG. 1).

The sensor layer 200 may include a plurality of first electrodes 210 and a plurality of second electrodes 220. Each of the first electrodes 210 may extend in the first direction DR1, and the first electrodes 210 may be arranged in the second direction DR2 to be spaced apart from each other. Each of the second electrodes 220 may extend in the second direction DR2, and the second electrodes 220 may be arranged in the first direction DR1 to be spaced apart from each other.

The second electrodes 220 may be insulated from the first electrodes 210 while crossing the first electrodes 210. Each of the first electrodes 210 and each of the second electrodes 220 may have a bar shape or a stripe shape. When the first electrodes 210 and the second electrodes 220 have the bar shape or the stripe shape, sensing characteristics with respect to continuous linear inputs may be improved. However, the shape of the first electrodes 210 and the shape of the second electrodes 220 should not be limited to the bar shape or the stripe shape.

The sensor controller 2000 may receive the control signal I-CS from the main controller 1000C (refer to FIG. 3) and may apply the coordinate signal I-SS to the main controller 1000C. The sensor controller 2000 may be referred to as a controller.

The sensor controller 2000 may include a sensor control circuit 200C1, a signal generating circuit 200C2, an input detecting circuit 200C3, and a switching circuit 200C4. The sensor control circuit 200C1, the signal generating circuit 200C2, and the input detecting circuit 200C3 may be implemented in a single chip, or some of the sensor control circuit 200C1, the signal generating circuit 200C2, and the input detecting circuit 200C3 may be implemented in a different chip from the other of the sensor control circuit 200C1, the signal generating circuit 200C2, and the input detecting circuit 200C3.

The sensor control circuit 200C1 may control an operation of the signal generating circuit 200C2 and the switching circuit 200C4, and the sensor control circuit 200C1 may calculate coordinates of the external input based on a driving signal applied thereto from the input detecting circuit 200C3 or may analyze information provided from the input device 2000 (refer to FIG. 3) based on a modulated signal applied thereto from the input detecting circuit 200C3. The sensor control circuit 200C1 may divide the active area 200A of the sensor layer 200 into a plurality of areas. The sensor control circuit 200C1 may provide the uplink signal ULS (refer to FIG. 3) to some areas of the plural areas and may provide an opposed-phase signal having a phase opposite to that of the uplink signal ULS (refer to FIG. 3) to the other areas of the plural areas. This will be described in detail later.

The signal generating circuit 200C2 may apply an output signal (or a driving signal) that is called a TX signal to the sensor layer 200. The signal generating circuit 200C2 may output the output signal corresponding to an operational mode to sensor layer 200.

The input detecting circuit 200C3 may convert an analog signal (or a sensing signal) that is called an RX signal provided from the sensor layer 200 to a digital signal. The input detecting circuit 200C3 may amplify the received analog signal and may filter the amplified signal. The input detecting circuit 200C3 may convert the filtered signal to the digital signal.

The switching circuit 200C4 may selectively control an electrical connection relation between the sensor layer 200 and the signal generating circuit 200C2 and/or between the sensor layer 200 and the input detecting circuit 200C3 in response to the control of the sensor control circuit 200C1. The switching circuit 200C4 may connect either the first electrodes 210 or the second electrodes 220 to the signal generating circuit 200C2 or may connect both the first electrodes 210 and the second electrodes 220 to the signal generating circuit 200C2 in response to the control of the sensor control circuit 200C1. Selectively, the switching circuit 200C4 may connect one of the first electrodes 210 and the second electrodes 220 or both the first electrodes 210 and the second electrodes 220 to the input detecting circuit 200C3.

A memory MM may store sensing values sensed by the first electrodes 210 and the second electrodes 220. The sensing values stored in the memory MM will be described later. FIG. 7 shows the memory MM separated from the sensor controller 2000 as a representative example, however, the memory MM should not be limited thereto or thereby. As an example, the memory MM may be included in the sensor controller 2000.

Figure 8:
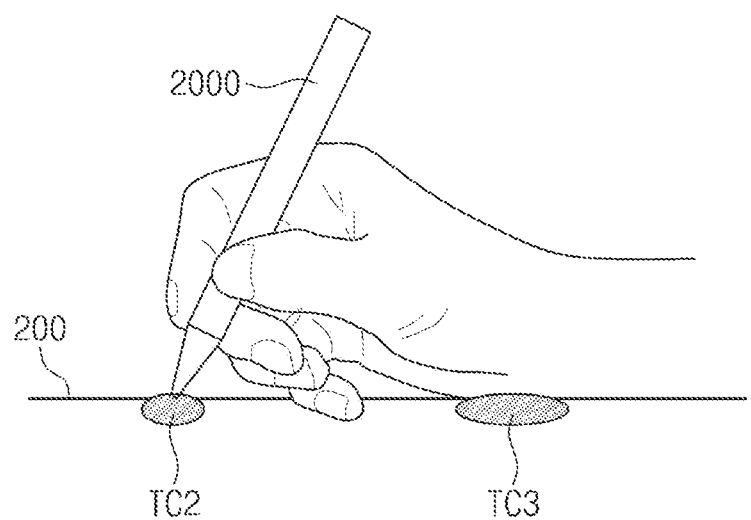
FIG. 8 is a view of a sensor layer to which a second input and a third input are applied according to some embodiments of the present disclosure.
Figure 9:
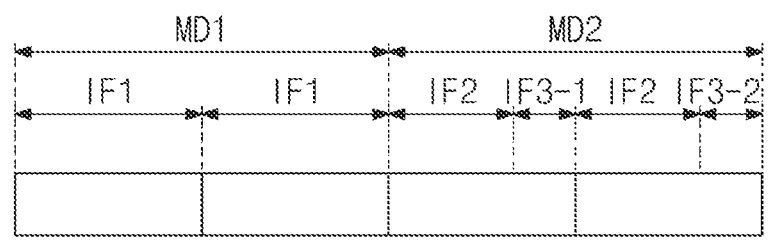
FIG. 9 is a conceptual view of operations in first and second modes according to some embodiments of the present disclosure.

FIG. 8 is a view of a sensor layer to which a second input and a third input are applied according to some embodiments of the present disclosure, and FIG. 9 is a conceptual view of operations in first and second modes according to some embodiments of the present disclosure.

Referring FIGS. 3, 8, and 9, the sensor layer 200 may sense the second input TC2 based on the input device 2000. In this case, a third input TC3 may be generated when a user's hand holding the input device 2000 comes into contact with the sensor layer 200.

The sensor controller 2000 may be operated in the first mode MD1 in which the first input TC1 generated by the user's body 3000 is sensed or the second mode MD2 in which the second input TC2 generated by the input device 2000 is sensed. The first mode MD1 and the second mode MD2 may be alternately repeated, however, this is merely an example. According to some embodiments, the operation of the sensor controller 2000 is not limited thereto or thereby. As an example, the sensor controller 2000 may be further operated in a standby mode waiting to detect the first input TC1 or the second input TC2 between the first mode MD1 and the second mode MD2.

The first mode MD1 may include at least one first operation period IF1. The sensor layer 200 may sense the first input TC1 in the first operation period IF1. FIG. 9 shows the first mode MD1 including two first operation periods IF1 as a representative example, however, the number of the first operation periods IF1 included in the first mode MD1 is not limited thereto or thereby.

The sensor controller 2000 may be operated in the second mode MD2 after the first mode MD1 is finished. The first mode MD1 and second mode MD2 may be alternately repeated.

The second mode MD2 may include a plurality of second operation periods IF2, third operation periods IF3-1, and fourth operation periods IF3-2. The sensor layer 200 may sense the second input TC2 in each of the second operation periods IF2. In the second mode MD2, the third operation period IF3-1 may proceed after the second operation period IF2. The sensor layer 200 may sense the third input TC3 in the third operation period IF3-1. A next second operation period IF2 may proceed after the third operation period IF3-1. The fourth operation period IF3-2 may proceed after the next second operation period IF2. The sensor layer 200 may sense the third input TC3 in the fourth operation period IF3-2. The first mode MD1 may proceed again after the fourth operation period IF3-2. The third operation period IF3-1 and the fourth operation period IF3-2 may be alternately repeated with the second operation period IF2 interposed therebetween. FIG. 9 shows the second mode MD2 including two second operation periods IF2, one third operation period IF3-1, and one fourth operation period IF3-2, however, the number of the second operation periods IF2, the number of the third operation periods IF3-1, and the number of the fourth operation periods IF3-2, which are included in the second mode MD2, is not limited thereto or thereby.

When the user removes the input device 2000 after using the input device 2000, the input device 2000 may move away from the sensor layer 200 first, and then the user's body 3000 may move away from the sensor layer 200. Different from the present disclosure, when the second mode MD2 in which the second input TC2 generated by the input device 2000 is sensed is changed to the first mode MD1 in which the first input TC1 generated by the user's body 3000 is sensed, the third input TC3 caused by unnecessary and unintended touch by the user may act as a noise in detecting the first input TC1 input by the user. Accordingly, a ghost touch phenomenon in which the input is sensed at coordinates different from those of the first input TC1 may occur. However, according to the present disclosure, the sensor controller 2000 may sense a portion of the active area 200A (refer to FIG. 7) in the third operation period IF3-1 and may sense the other portion of the active area 200A (refer to FIG. 7) in the fourth operation period IF3-2 to sense the third input TC3. When the sensor controller 2000 senses the first input TC1 in the first mode MD1, the third input TC3 may be removed based on the third input TC3 sensed in the third operation period IF3-1 and the fourth operation period IF3-2 such that the third input TC3 is not sensed as the noise. Accordingly, the first input TC1 may be accurately sensed in the first mode MD1, and the occurrence of the ghost touch phenomenon may be prevented. Thus, the sensing reliability of the electronic device 1000 may be improved.

Figure 10:
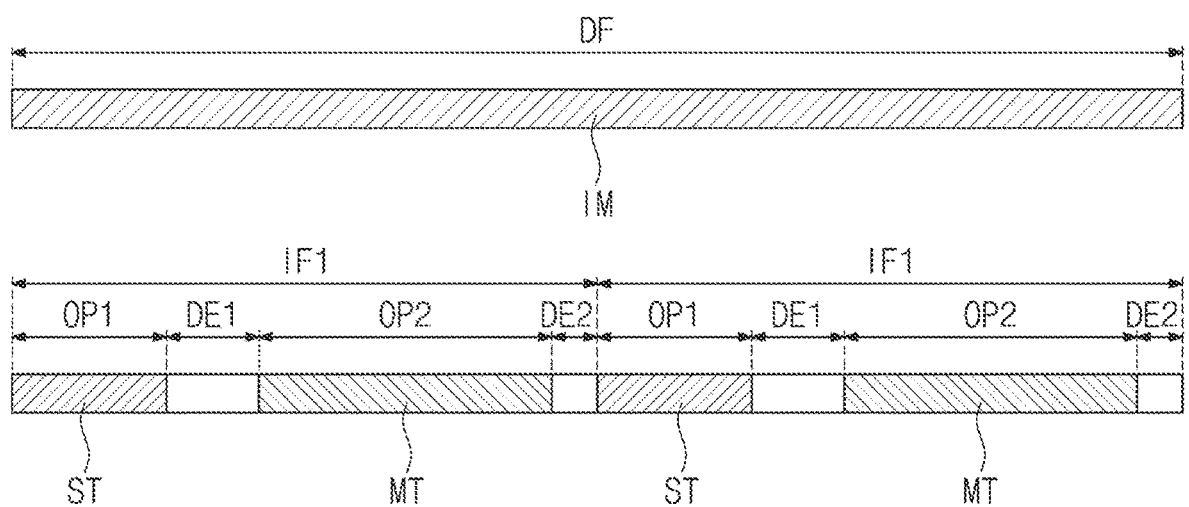
FIG. 10 is a conceptual view of an operation in a first mode according to some embodiments of the present disclosure.
Figure 11A:
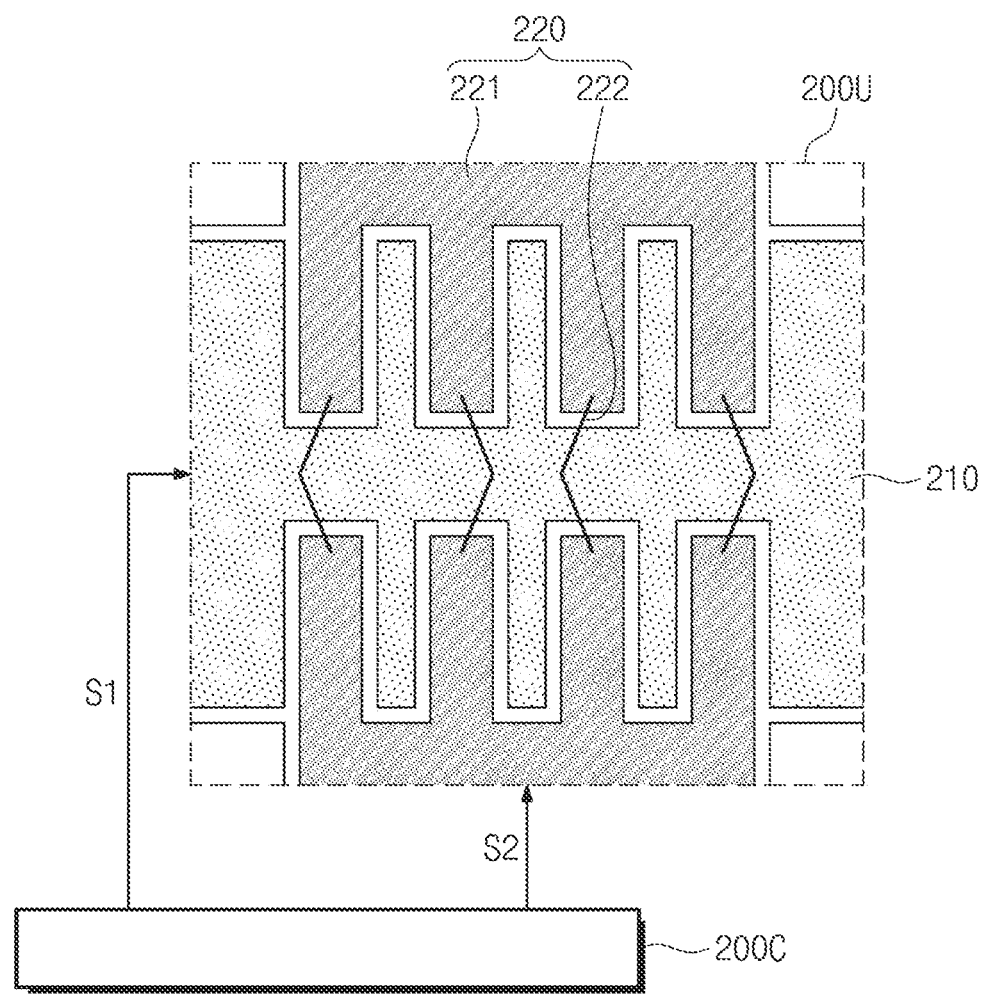
FIGS. 11A and 11B are plan views of a sensor layer operated in a first mode according to some embodiments of the present disclosure.
Figure 11B:
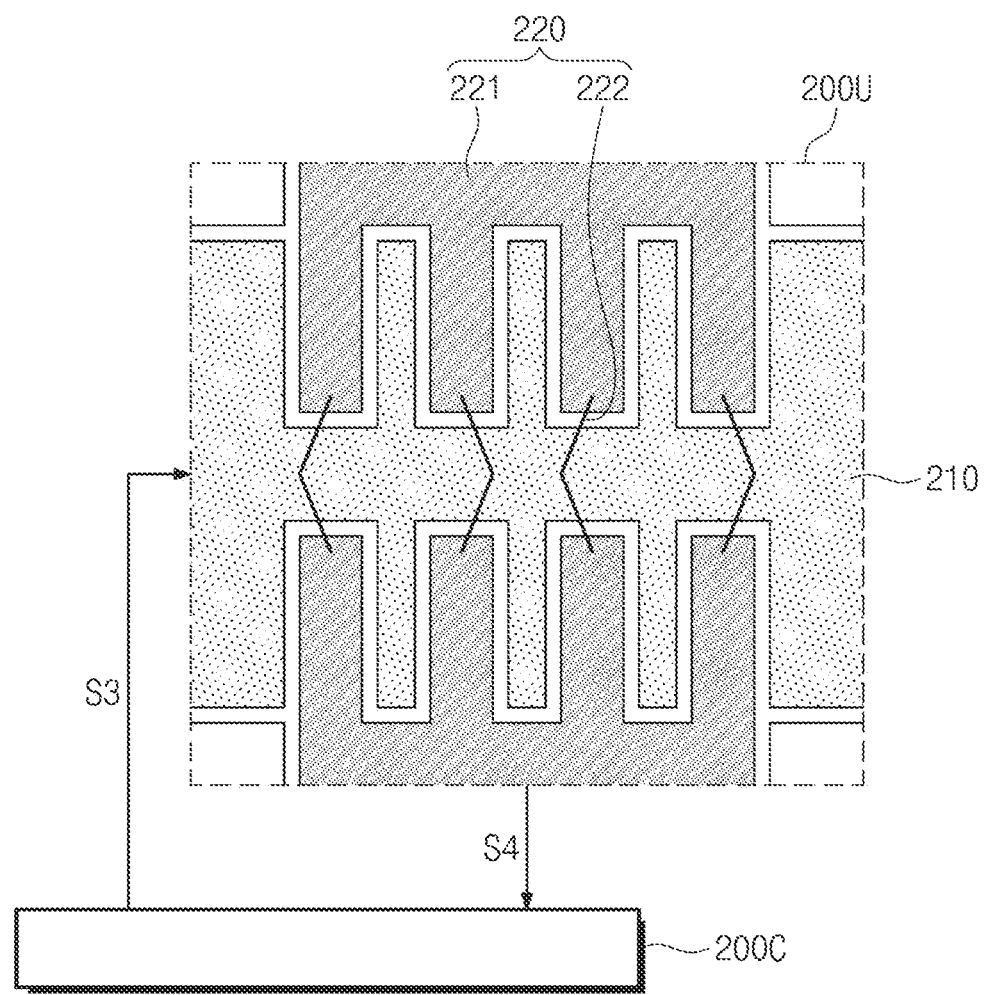

FIG. 10 is a conceptual view of an operation in the first mode according to some embodiments of the present disclosure, and FIGS. 11A and 11B are plan views of the sensor layer operated in the first mode according to some embodiments of the present disclosure.

Referring to FIGS. 3, 10, 11A, and 11B, the electronic device 1000 may display the image IM through the display layer 100. The display layer 100 may display the image IM in the unit of one display frame DF. When an operating frequency of the display layer 100 is 120 Hertz (Hz), a time corresponding to one display frame DF may be about 8.33 milliseconds (ms).

The electronic device 1000 may sense the first input TC1 and the second input TC2 while displaying the image IM through the display layer 100. The electronic device 1000 may be operated in the first mode MD1 (refer to FIG. 9) in which the first input TC1 is sensed or in the second mode MD2 (refer to FIG. 9) in which the second input TC2 is sensed depending on presence or absence of the input device 2000. As an example, when the input device 2000 is not sensed, the electronic device 1000 may be operated in the first mode MD1 (refer to FIG. 9), and when the input device 2000 is sensed, the electronic device 1000 may be operated in the second mode MD2 (refer to FIG. 9).

The sensor layer 200 may have an operating frequency equal to or higher than the operating frequency of the display layer 100 in the first mode MD1 (refer to FIG. 9) and the second mode MD2 (refer to FIG. 9). As an example, when the operating frequency of the display layer 100 is about 120 Hz, the operating frequency of the sensor layer 200 may be about 240 Hz. When the sensor layer 200 is operated in the first mode MD1 (refer to FIG. 9), the first input TC1 may be sensed in the unit of one first operation period IF1 of the sensor layer 200. As an example, a time corresponding to the first operation period IF1 may be about 4.16 ms.

The first operation period IF1 may include a first sensing period OP1 and a second sensing period OP2. When the sensor layer 200 is operated in the first mode MD1 (refer to FIG. 9), the sensor layer 200 may sense the first input TC1 in the first sensing period OP1 and the second sensing period OP2.

In the first sensing period OP1, the sensor layer 200 may sense the first input TC1 using the first electrodes 210 and the second electrodes 220 that are integrated into one electrode with each other. When the sensor layer 200 is operated in the first sensing period OP1, the sensor layer 200 may be defined as being operated in a self-touch manner ST.

FIG. 11A shows a portion of the sensor layer 200 operated in the self-touch manner ST. A portion of one first electrode 210 and a portion of one second electrode 220 may be defined as one sensing unit 200U.

The second electrode 220 may include crossing patterns 221 and bridge patterns 222 electrically connected to the crossing patterns 221. The crossing patterns 221 may be spaced apart from each other with the first electrode 210 interposed therebetween. The bridge patterns 222 may overlap the first electrode 210, and the bridge patterns 222 may be insulated from the first electrode 210 while crossing the first electrode 210.

The crossing patterns 221 and the first electrode 210 may be located on the same layer as each other, and the bridge patterns 222 may be located on a layer different from a layer on which the crossing patterns 221 and the first electrode 210 are located. As an example, the crossing patterns 221 and the first electrode 210 may be included in the second conductive layer 204 (refer to FIG. 5), the bridge patterns 222 may be included in the first conductive layer 202 (refer to FIG. 5), and this structure may be referred to as a bottom bridge structure. However, the present disclosure should not be limited thereto or thereby. According to some embodiments, the crossing patterns 221 and the first electrode 210 may be included in the first conductive layer 202 (refer to FIG. 5), the bridge patterns 222 may be included in the second conductive layer 204 (refer to FIG. 5), and this structure may be referred to as a top bridge structure.

Each of the crossing patterns 221 and the first electrode 210 may have a mesh structure. In this case, an opening may be defined through each of the crossing patterns 221 and the first electrode 210, however, it should not be limited thereto or thereby. According to some embodiments, each of the crossing patterns 221 and the first electrode 210 may be provided as a single transparent electrode.

In the self-touch manner ST, the sensor controller 2000 may provide a first sensing signal S1 to the first electrode 210 and may provide a second sensing signal S2 to the second electrode 220. In this case, the sensor controller 2000 may sense touch coordinates of the first input TC1 based on an amount of electric charge charged in the capacitor.

In the second sensing period OP2, the sensor layer 200 may sense the first input TC1 using the first electrodes 210 and the second electrodes 220 capacitively coupled with the first electrodes 210. When the sensor layer 200 is operated in the second sensing period OP2, the sensor layer 200 may be defined as being operated in a mutual touch manner MT.

FIG. 11B shows a portion of the sensor layer 200 operated in the mutual touch manner MT. In the mutual touch manner MT, the sensor controller 2000 may provide an output signal S3 to the first electrode 210, and the sensor controller 2000 may receive a sensing signal S4 from the second electrode 220. That is, the first electrode 210 may serve as a transmission electrode, and the second electrode 220 may serve as a reception electrode, however, they should not be particularly limited. As an example, the first electrode 210 may serve as the reception electrode, and the second electrode 220 may serve as the transmission electrode. In this case, the sensor controller 2000 may sense the touch coordinates of the first input TC1 based on a difference in electric charge amount between the first electrode 210 and the second electrode 220.

In the first operation period IF1, the second sensing period OP2 may follow the first sensing period OP1. In addition, a time width of the second sensing period OP2 may be greater than a time width of the first sensing period OP1.

The first operation period IF1 may further include a first delay period DE1. The first delay period DE1 may be located between the first sensing period OP1 and the second sensing period OP2. That is, the first sensing period OP1 may be separated from the second sensing period OP2 by the first delay period DE1 in respect of time.

The first operation period IF1 may further include a second delay period DE2. The second delay period DE2 may follow the second sensing period OP2. That is, when the second sensing period OP2 is finished, a next first operation period IF1 may start after being delayed by the second delay period DE2.

Figure 12:
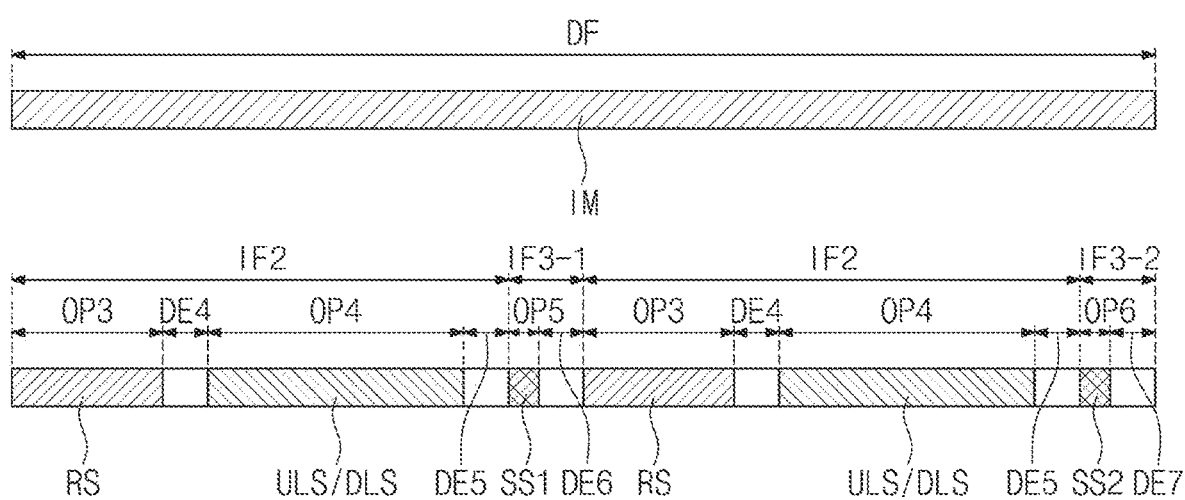
FIG. 12 is a conceptual view of an operation in a second mode according to some embodiments of the present disclosure.
Figure 13A:
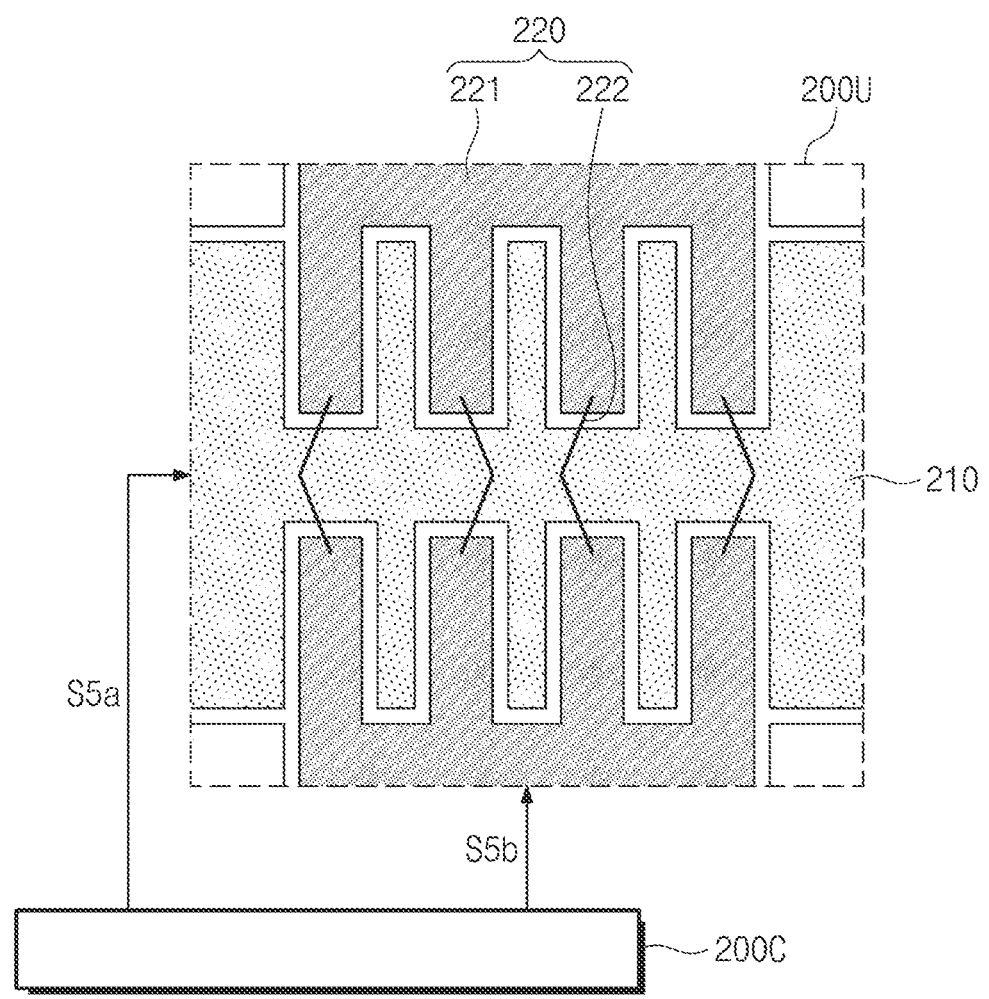
FIGS. 13A and 13B are plan views of a sensor layer operated in a second mode according to some embodiments of the present disclosure.
Figure 13B:
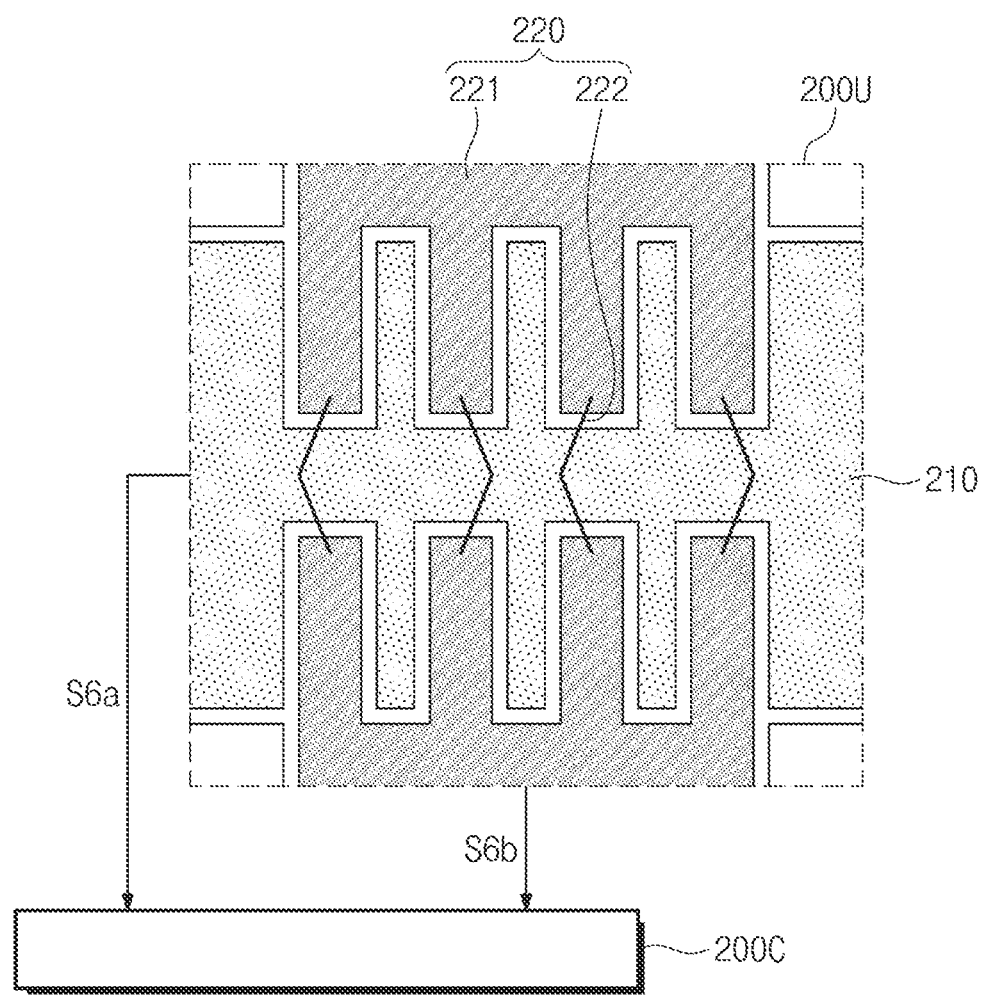

FIG. 12 is a conceptual view of an operation in the second mode according to some embodiments of the present disclosure, and FIGS. 13A and 13B are plan views of the sensor layer operated in the second mode according to some embodiments of the present disclosure. In FIG. 12, the same reference numerals denote the same elements in FIG. 10, and thus, some detailed descriptions of the same elements may be omitted. In FIGS. 13A and 13B, the same reference numerals denote the same elements in FIGS. 11A and 11B, and thus, some detailed descriptions of the same elements may be omitted.

Referring to FIGS. 3, 12, 13A, and 13B, the second operation period IF2 may include a first period OP3 and a second period OP4. When the sensor layer 200 is operated in the second mode MD2 (refer to FIG. 9), the sensor layer 200 may sense the second input TC2 in the first period OP3 and the second period OP4.

In the first period OP3, the sensor controller 2000 may provide a recognition signal RS to the sensor layer 200 to recognize an input device 2000.

In the second period OP4, the sensor controller 2000 may provide the uplink signal ULS to the sensor layer 200 and may receive the downlink signal DLS from the sensor layer 200, and thus, may sense the second input TC2 input through the input device 2000.

The second mode MD2 (refer to FIG. 9) may be a mode in which the electronic device 1000 and the input device 2000 transmit and receive data to and from each other. The operation shown in FIG. 13A may be an operation in which the uplink signal is provided to the input device 2000 from the electronic device 1000.

Referring to FIG. 13A, the first electrode 210 and the second electrode 220 may be used as transmission electrodes to transmit uplink signals S5a and S5b provided from the sensor controller 2000 to the input device 2000, respectively, however, they should not be limited thereto or thereby. As an example, the first electrode 210 or the second electrode 220 may be used as a transmission electrode.

Referring to FIG. 13B, the first electrode 210 and the second electrode 220 may be used as reception electrodes to transmit sensing signals S6a and S6b induced from the input device 2000 (refer to FIG. 1) to the sensor controller 2000, respectively. The sensor controller 2000 may receive a first sensing signal S6a from the first electrode 210 and may receive a second sensing signal S6b from the second electrode 220.

The second operation period IF2 may further include a fourth delay period DE4. The fourth delay period DE4 may be located between the first period OP3 and the second period OP4. That is, the first period OP3 may be separated from the second period OP4 by the fourth delay period DE4 in respect of time.

The second operation period IF2 may further include a fifth delay period DE5. The fifth delay period DE5 may follow the second period OP4. That is, when the second period OP4 is finished, the third operation period IF3-1 may start after being delayed by the fifth delay period DE5.

The third operation period IF3-1 may be continued after the second operation period IF2.

The third operation period IF3-1 may include a third sensing period OP5 and a sixth delay period DE6.

In the third sensing period OP5, the third input TC3 (refer to FIG. 8) caused by the user's touch may be sensed in a portion of the active area 200A (refer to FIG. 7). The sensor controller 2000 may calculate a first sensing value SS1 based on the third input TC3 (refer to FIG. 8).

The first sensing value SS1 may be a value with respect to a touch generated when the user's hand gripping the input device 2000 comes into contact with the sensor layer 200. The first sensing value SS1 may include shape information and location information of the touch. The sensor controller 2000 may determine whether the third input TC3 (refer to FIG. 8) is generated by the user's hand gripping the input device 2000 based on the shape information and the location information. The first sensing value SS1 may be stored in the memory MM (refer to FIG. 7). The first sensing value SS1 may be sensed in the same manner as the self-touch manner ST (refer to FIG. 10). However, this is merely an example, and the method of sensing the first sensing value SS1 should not be limited thereto or thereby. As an example, the first sensing value SS1 may be sensed by the same manner as the mutual touch manner MT (refer to FIG. 10).

The sixth delay period DE6 may follow the third sensing period OP5. That is, when the third sensing period OP5 is finished, the second operation period IF2 may start again after being delayed by the sixth delay period DE6.

The fourth operation period IF3-2 may be continued after the second operation period IF2.

The fourth operation period IF3-2 may include a fourth sensing period OP6 and a seventh delay period DE7.

In the fourth sensing period OP6, the third input TC3 (refer to FIG. 8) caused by the user's touch may be sensed in the other portion of the active area 200A (refer to FIG. 7). The sensor controller 2000 may calculate a second sensing value SS2 based on the third input TC3 (refer to FIG. 8).

The second sensing value SS2 may be a value with respect to a touch generated when the user's hand gripping the input device 2000 comes into contact with the sensor layer 200. The second sensing value SS2 may include shape information and location information of the touch. The sensor controller 2000 may determine whether the third input TC3 (refer to FIG. 8) is generated by the user's hand gripping the input device 2000 based on the shape information and the location information. The second sensing value SS2 may be stored in the memory MM (refer to FIG. 7). The second sensing value SS2 may be sensed in the same manner as the self-touch manner ST (refer to FIG. 10). However, this is merely an example, and the method of sensing the second sensing value SS2 should not be limited thereto or thereby. As an example, the second sensing value SS2 may be sensed by the same manner as the mutual touch manner MT (refer to FIG. 10).

The seventh delay period DE7 may follow the fourth sensing period OP6. That is, when the fourth sensing period OP6 is finished, the first mode MD1 (refer to FIG. 9) may start after being delayed by the seventh delay period DE7.

The sensor controller 2000 may determine whether the third input TC3 is present based on the first sensing value and the second sensing value when the operation mode is changed from the second mode MD2 (refer to FIG. 9) to the first mode MD1 (refer to FIG. 9).

The sensor controller 2000 may sense the third input TC3 (refer to FIG. 8) based on the first sensing value and the second sensing value. When the first input TC1 is sensed in a next first mode MD1 (refer to FIG. 9), the sensor controller 2000 may ignore the third input TC3 (refer to FIG. 8). That is, the sensor controller 2000 may exclude the third input TC3 sensed in the third operation period IF3-1 and the fourth operation period IF3-2 when the operation mode is changed from the second mode MD2 (refer to FIG. 9) to the first mode MD1 (refer to FIG. 9).

As an example, in the case where the second mode MD2 (refer to FIG. 9) is terminated after the third operation period IF3-1 and the first mode MD1 (refer to FIG. 9) starts, the sensor controller 2000 may combine the second sensing value SS2 sensed in a previous fourth operation period IF3-2 and stored in the memory MM (refer to FIG. 7) with the first sensing value SS1 sensed in a last third operation period IF3-1 and may calculate the third input TC3 (refer to FIG. 8) sensed in the active area 200A (refer to FIG. 7). When the first input TC1 is sensed in the first mode MD1 (refer to FIG. 9), the sensor controller 2000 may exclude the third input TC3 (refer to FIG. 8) such that the third input TC3 (refer to FIG. 8) may not be sensed as the noise based on the calculated third input TC3 (refer to FIG. 8).

According to some embodiments, in the case where the second mode MD2 (refer to FIG. 9) is terminated after the fourth operation period IF3-2 and the first mode MD1 (refer to FIG. 9) starts, the sensor controller 2000 may combine the first sensing value SS1 sensed in a previous fourth operation period IF3-1 and stored in the memory MM (refer to FIG. 7) with the second sensing value SS2 sensed in a last fourth operation period IF3-2 and may calculate the third input TC3 (refer to FIG. 8) sensed in the active area 200A (refer to FIG. 7). When the first input TC1 is sensed in the first mode MD1 (refer to FIG. 9), the sensor controller 2000 may exclude the third input TC3 (refer to FIG. 8) such that the third input TC3 (refer to FIG. 8) may not be sensed as the noise based on the calculated third input TC3 (refer to FIG. 8).

According to the present disclosure, the third input TC3 caused by unnecessary and unintended touch by the user may be removed in the first mode MD1. The first input TC1 may be accurately sensed, and the occurrence of the ghost touch phenomenon may be prevented. Accordingly, the sensing reliability of the electronic device 1000 may be improved.

Figure 14:
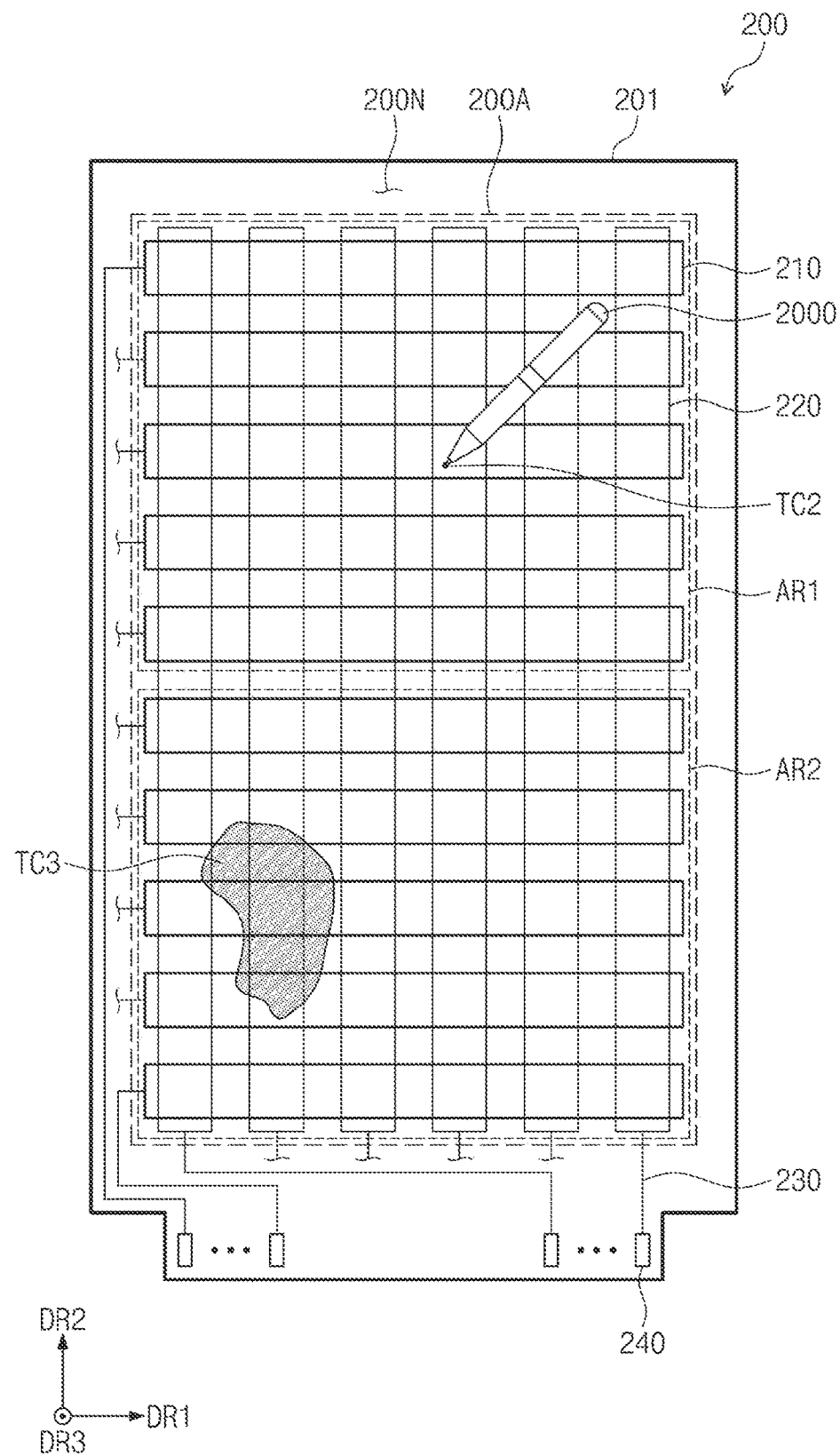
FIG. 14 is a plan view of a sensor layer according to some embodiments of the present disclosure.

FIG. 14 is a plan view of the sensor layer 200 according to some embodiments of the present disclosure.

Referring to FIGS. 12 and 14, the sensor layer 200 may include the base insulating layer 201, the first electrodes 210, the second electrodes 220, a plurality of lines 230, and a plurality of pads 240.

The first electrodes 210 and the second electrodes 220 may be located in the active area 200A. The lines 230 and the pads 240 may be located in the peripheral area 200N.

The sensor controller 2000 may previously divide the active area 200A of the sensor layer 200 into a plurality of areas AR1 and AR2. The areas AR1 and AR2 may include a first area AR1 and a second area AR2. As an example, the first area AR1 may correspond to a portion of the active area 200A shown in FIG. 7, and the second area AR2 may correspond to the other portion of the active area 200A shown in FIG. 7.

The first area AR1 and the second area AR2 may have the same size, however, the size of each of the first area AR1 and the second area AR2 should not be limited thereto or thereby. As an example, the size of each of the first area AR1 and the second area AR2 should not be particularly limited as long as the first area AR1 and the second area AR2 may entirely cover the active area 200A.

The second input TC2 may be provided to the first area AR1. The sensor layer 200 may sense the second input TC2 based on the input device 2000. In this case, the user's hand gripping the input device 2000 may come into contact with the second area AR2, and the third input TC3 may be generated.

When the user removes the input device 2000 after using the input device 2000, the input device 2000 may move away from the sensor layer 200 first, and then the user's body 3000 may move away from the sensor layer 200. Different from the present disclosure, when the second mode MD2 (refer to FIG. 9) in which the second input TC2 generated by the input device 2000 is sensed is changed to the first mode MD1 (refer to FIG. 9) in which the first input TC1 generated by the user's body 3000 is sensed, the third input TC3 caused by the unnecessary and unintended touch by the user may act as a noise in detecting the first input TC1 input by the user. Accordingly, the ghost touch phenomenon in which the input is sensed at coordinates different from those of the first input TC1 (refer to FIG. 3) may occur. However, according to the present disclosure, the sensor controller 2000 may sense the first area AR1 of the active area 200A in the third operation period IF3-1, may sense the second area AR2 of the active area 200A in the fourth operation period IF3-2, and thus may sense the third input TC3. When the sensor controller 2000 senses the first input TC1 (refer to FIG. 3) in the first mode MD1 (refer to FIG. 9), the third input TC3 may be removed such that the third input TC3 may not be sensed as the noise based on the third input TC3 sensed in the third operation period IF3-1 and the fourth operation period IF3-2. Accordingly, the first input TC1 (refer to FIG. 3) may be accurately sensed in the first mode MD1 (refer to FIG. 9), and the occurrence of the ghost touch phenomenon may be prevented. Thus, the sensing reliability of the electronic device 1000 (refer to FIG. 1) may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims, and their equivalents.

What is claimed is:

1. An electronic device comprising:
   a display layer;
   a sensor layer on the display layer and comprising an active area and a peripheral area, wherein the sensor layer is configured to operate in a first mode and a second mode different from the first mode; and
   a sensor controller configured to control the sensor layer, wherein the first mode comprises a first operation period, the second mode comprises a plurality of second operation periods and a third operation period following one of the second operation periods, and the sensor controller is configured to sense a first input generated by a touch in the first operation period, to sense a second input generated by an input device in one of the second operation periods, to sense a third input generated by a touch different from the touch generating the first input in a portion of the active area in the third operation period, and to calculate a first sensing value.

2. The electronic device of claim 1, wherein the second mode further comprises a fourth operation period following another of the second operation periods, and the sensor controller is configured to sense the third input in the other portion of the active area in the fourth operation period and to calculate a second sensing value.

3. The electronic device of claim 2, further comprising a memory configured to store the first sensing value and the second sensing value.

4. The electronic device of claim 2, wherein the sensor controller is configured to determine whether or not the third input is present based on the first sensing value and the second sensing value in response to the second mode being changed to the first mode.

5. The electronic device of claim 2, wherein each of the first sensing value and the second sensing value comprises shape information and location information of the touch.

6. The electronic device of claim 5, wherein the first mode and the second mode are repeated, and the sensor controller is configured to sense the third input based on the shape information and the location information and to ignore the third input in response to sensing the first input in a next first mode.

7. The electronic device of claim 1, wherein the sensor layer comprises a plurality of first electrodes extending in a first direction and a plurality of second electrodes extending in a second direction crossing the first direction.

8. The electronic device of claim 7, wherein the first operation period comprises a first sensing period and a second sensing period, the sensor layer is configured to sense the first input using the first electrodes and the second electrodes integrated into one electrode with the first electrodes in the first sensing period, and the sensor layer is configured to sense the first input using the first electrodes and the second electrodes capacitively coupled to the first electrodes in the second sensing period.

9. The electronic device of claim 7, wherein a second operation period comprises a first period and a second period, the sensor layer is configured to output a recognition signal in the first period to recognize the input device, and the sensor layer is configured to sense the second input in the second period.

10. The electronic device of claim 7, wherein the sensor layer is configured to sense the third input using the first electrodes and the second electrodes integrated into one electrode with the first electrodes in the third operation period.

11. An electronic device comprising:
    a display layer;
    a sensor layer on the display layer and comprising an active area and a peripheral area, wherein the sensor layer is configured to be repeatedly operated in a first mode and a second mode different from the first mode; and
    a sensor controller configured to control the sensor layer, wherein the active area comprises a first area and a second area adjacent to the first area, the first mode comprises a first operation period, the second mode comprises a plurality of second operation periods, a third operation period following one of the second operation periods, and a fourth operation period following another of the second operation periods, the sensor controller is configured to sense a first input generated by a touch in the first operation period and to sense a second input generated by an input device in the one of the second operation periods, and the sensor layer is configured to sense a third input generated by a touch different from the touch generating in the first area in the third operation period to calculate a first sensing value and to sense the third input in the second area in the fourth operation period to calculate a second sensing value.

12. The electronic device of claim 11, wherein the first area and the second area have a same size.

13. The electronic device of claim 11, further comprising a memory configured to store the first sensing value and the second sensing value.

14. The electronic device of claim 11, wherein the sensor controller is configured to determine whether or not the third input is present based on the first sensing value and the second sensing value in response to the second mode being changed to the first mode.

15. The electronic device of claim 11, wherein each of the first sensing value and the second sensing value comprises shape information and location information of the touch.

16. The electronic device of claim 15, wherein the sensor controller is configured to sense the third input based on the shape information and the location information and to ignore the third input in response to sensing the first input in a next first mode.

17. The electronic device of claim 11, wherein the sensor layer comprises a plurality of first electrodes extending in a first direction and a plurality of second electrodes extending in a second direction crossing the first direction.

18. The electronic device of claim 17, wherein the first operation period comprises a first sensing period and a second sensing period, the sensor layer is configured to sense the first input using the first electrodes and the second electrodes integrated into one electrode with the first electrodes in the first sensing period, and the sensor layer is configured to sense the first input using the first electrodes and the second electrodes capacitively coupled to the first electrodes in the second sensing period.

19. The electronic device of claim 17, wherein a second operation period comprises a first period and a second period, the sensor layer is configured to output a recognition signal in the first period to recognize the input device, and the sensor layer is configured to sense the second input in the second period.

20. The electronic device of claim 17, wherein the sensor layer is configured to sense the third input using the first electrodes and the second electrodes integrated into one electrode with the first electrodes in the third operation period.

\* \* \* \* \*